(12) United States Patent
Mishra et al.

(10) Patent No.: US 12,283,961 B2
(45) Date of Patent: Apr. 22, 2025

(54) AUTOMATIC CLOCK RATE SYNCHRONIZATION FOR 1-WIRE RADIO FREQUENCY FRONT-END INTERFACE

(71) Applicant: QUALCOMM Incorporated, San Diego, CA (US)

(72) Inventors: Lalan Jee Mishra, Escondido, CA (US); Umesh Srikantiah, San Diego, CA (US); Richard Dominic Wietfeldt, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 43 days.

(21) Appl. No.: 18/449,554

(22) Filed: Aug. 14, 2023

(65) Prior Publication Data

US 2025/0062758 A1 Feb. 20, 2025

(51) Int. Cl.
*H03K 5/24* (2006.01)
*H03K 3/037* (2006.01)
*H03K 3/356* (2006.01)

(52) U.S. Cl.
CPC ............. *H03K 5/249* (2013.01); *H03K 3/037* (2013.01); *H03K 3/356095* (2013.01)

(58) Field of Classification Search
CPC .. H03K 5/249; H03K 3/037; H03K 3/356095; H03K 3/00; H03K 3/01; H03K 3/013; H03K 3/0233; H03K 3/027; H03K 3/64; H03K 3/78; G04F 5/00
See application file for complete search history.

(56) References Cited

U.S. PATENT DOCUMENTS 5,359,232 A * 10/1994 Eitrheim ................... G06F 1/10
327/175
5,928,293 A 7/1999 Jobling et al.

OTHER PUBLICATIONS

International Search Report and Written Opinion—PCT/US2024/035820—ISA/EPO—Oct. 17, 2024.

* cited by examiner

*Primary Examiner* — Jung Kim
(74) *Attorney, Agent, or Firm* — Loza & Loza, LLP/Qualcomm

(57) ABSTRACT

A clock generation apparatus includes a counter configured to count transitions in a locally generated clock signal when a data signal is received from a 1-wire serial bus, a latch configured to capture an output of the counter and to provide a latched output representative of the transitions counted in the locally generated clock signal while a synchronization pattern is received in the data signal, a flipflop and a comparator configured to drive a decision signal to a first signaling state when the output of the counter matches the latched output and to drive the decision signal to a second signaling state when the output of the counter does not match the latched output. The flipflop has an output that changes signaling state in response to an edge in the decision signal. The counter is reset when the decision signal is driven to the first signaling state.

30 Claims, 16 Drawing Sheets

AUTOMATIC CLOCK RATE SYNCHRONIZATION FOR 1-WIRE RADIO FREQUENCY FRONT-END INTERFACE

TECHNICAL FIELD

The present disclosure relates generally to serial communication and, more particularly, to clock management in a device configured for one-wire communication through a Radio Frequency Front-End interface.

BACKGROUND

Mobile communication devices may include a variety of components including circuit boards, integrated circuit (IC) devices and/or System-on-Chip (SoC) devices. The components may include processing circuits, user interface components, storage and other peripheral components that communicate through a serial bus. The serial bus may be operated in accordance with a standardized or proprietary protocol. In one example, a two-wire multi-drop serial bus is operated in accordance with an Inter-Integrated Circuit (I2C or I²C) protocol, which was developed to connect low-speed peripherals to a processor. An I2C bus provides a Serial Data Line (SDA) that carries a data signal, and a Serial Clock Line (SCL) that carries a clock signal. In another example, the Improved Inter-Integrated Circuit (I3C) protocols defined by the Mobile Industry Processor Interface (MIPI) Alliance derive certain implementation aspects from the I2C protocol including separate clock and data lines. In another example, the Radio Frequency Front-End (RFFE) interface defined by the MIPI Alliance provides a communication interface for controlling various radio frequency (RF) front-end devices, including power amplifiers (PAs), low-noise amplifiers (LNAs), antenna tuners, filters, sensors, power management devices, switches, etc. These devices may be collocated in a single IC device or provided in multiple IC devices. In a mobile communication device, multiple antennas and radio transceivers may support multiple concurrent RF links. In another example, the system power management interface (SPMI) defined by the MIPI Alliance provides a hardware interface that may be implemented between baseband or application processors and peripheral components for purposes that include power management within a device.

Increased device complexity and an associated increased demand for general-purpose input/output (GPIO) pins has prompted the use of one-wire serial buses operated according to standards-compliant or compatible protocols. There is a continual demand for increased reliability and throughput over one-wire serial buses, including one-wire serial buses operated according MIPI-defined protocols.

SUMMARY

Certain aspects of the disclosure relate to systems, apparatus, methods and techniques that can improve clock generation at a receiver coupled to a one-wire serial bus. In one example, reliability of data capture can be enhanced when transmitter clock rate is quickly and reliably determined by the receiver. In some implementations, certain aspects of control signaling and Manchester encoding can be used to initiate clock rate detection. The one-wire serial bus may operate in accordance with an RFFE, SPMI or other standards-defined protocol.

In various aspects of the disclosure, a clock generation apparatus includes a counter configured to count transitions in a locally generated clock signal when a data signal is received from a 1-wire serial bus, a latch configured to capture an output of the counter and to provide a latched output representative of the transitions counted in the locally generated clock signal while a synchronization pattern is received in the data signal, a flipflop and a comparator configured to drive a decision signal to a first signaling state when the output of the counter matches the latched output and to drive the decision signal to a second signaling state when the output of the counter does not match the latched output. The flipflop has an output that changes signaling state in response to an edge in the decision signal. The counter is reset when the decision signal is driven to the first signaling state.

In various aspects of the disclosure, an apparatus includes means for counting transitions in a locally generated clock signal, including a counter configured to count the transitions when a data signal is received from a 1-wire serial bus, means for capturing an output of the counter, including a latch configured to provide a latched output representative of the transitions counted in the locally generated clock signal while a synchronization pattern is received in the data signal, a flipflop, and means for comparing the output of the counter and the latched output, including a comparator configured to drive a decision signal to a first signaling state when the output of the counter matches the latched output, and drive the decision signal to a second signaling state when the output of the counter does not match the latched output. The flipflop may be clocked by the decision signal and may have an output that changes signaling state in response to an edge in the decision signal. The counter may be reset when the decision signal is driven to the first signaling state.

In various aspects of the disclosure, a method for generating a rate matched clock signal includes configuring a counter to count transitions in a locally generated clock signal when a data signal is received from a 1-wire serial bus, configuring a latch to capture an output of the counter and to provide a latched output representative of the transitions counted in the locally generated clock signal while a synchronization pattern is received in the data signal, and configuring a comparator to: drive a decision signal to a first signaling state when the output of the counter matches the latched output; and drive the decision signal to a second signaling state when the output of the counter does not match the latched output. The decision signal may be configured to clock a flipflop that has an output that changes signaling state in response to an edge in the decision signal. The counter may be reset when the decision signal is driven to the first signaling state.

In certain aspects, the latched output represents the transitions counted in the locally generated clock signal during a portion of the synchronization pattern. The portion of the synchronization pattern may include two transitions in signaling state of the data signal. The portion of the synchronization pattern may correspond to one or more bit transmission intervals. The portion of the synchronization pattern may correspond to one and a half bit transmission intervals.

In one aspect, gating logic may be configured to select bits of the output of the counter to be captured by the latch.

In certain aspects, a controller may be configured to enable the latch and the counter when the synchronization pattern is being received in the data signal, and enable the counter and the flipflop after the synchronization pattern has been terminated and while transitions are detected in the data signal. The controller may be further configured to disable the flipflop when the synchronization pattern is being received in the data signal, and disable the latch after the synchronization pattern has been terminated. The output of the flipflop may provide a receive clock signal that has a frequency matched to a data rate associated with the data signal. The controller may be further configured to reset the counter when a transition is detected at a center of a bit transmission interval after the synchronization pattern has been terminated.

In one aspect, the data signal is encoded using Manchester encoding.

DETAILED DESCRIPTION

Figure 1:
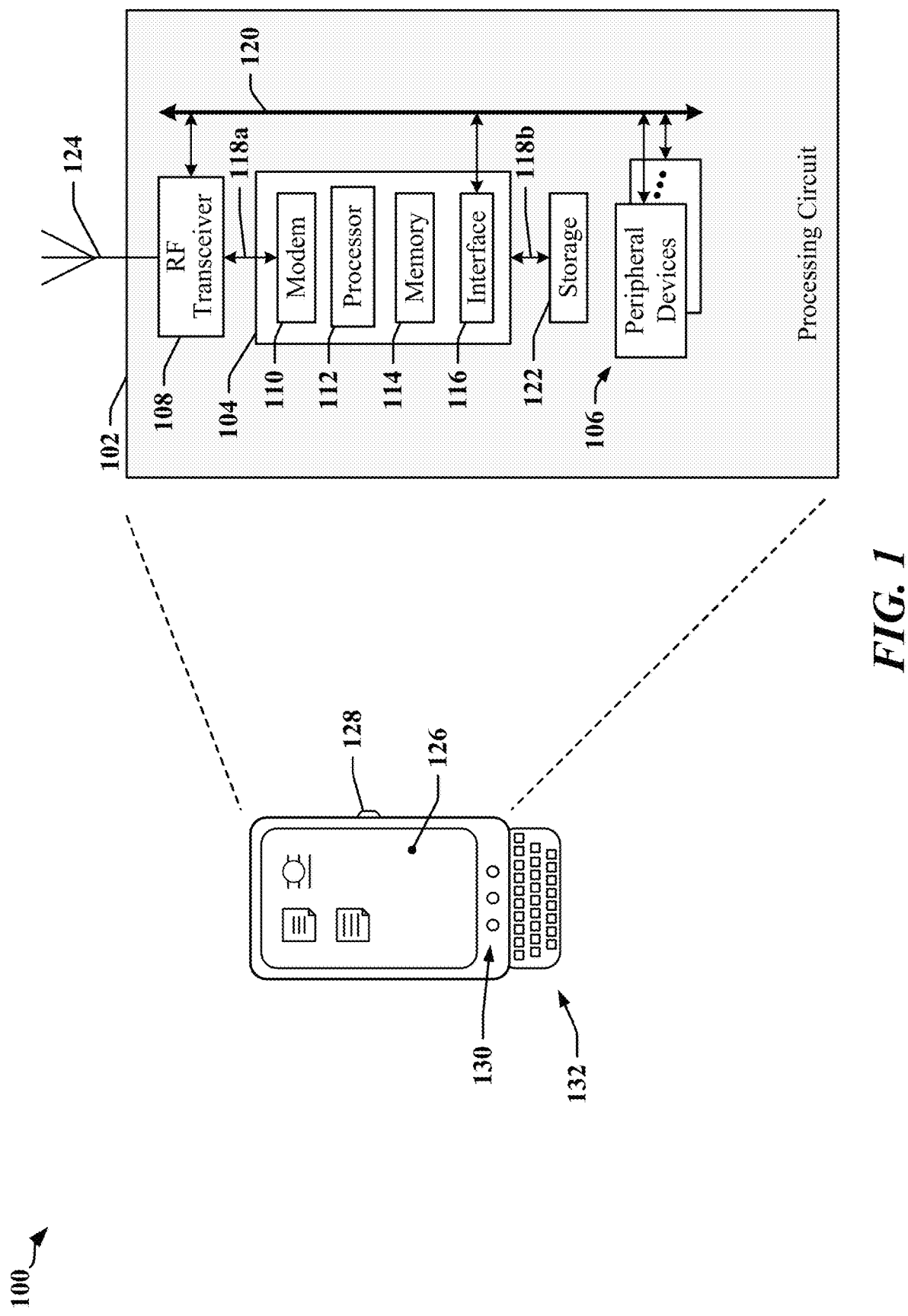
FIG. 1 illustrates an apparatus employing a data link between IC devices that is selectively operated according to one of plurality of available standards.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Several aspects of the invention will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

Certain aspects of the disclosure relate to multidrop serial bus configurations in which multiple devices can communicate at various times. The described serial buses are typically operated in a hierarchical manner, in that one device controls communication during a transaction. The controlling device may be referred to as a host device, a bus master device, a managing device or another term favored by standards defining the protocols implemented by the controlling device. In some serial bus configurations, a single controlling device manages or controls communication during all transactions conducted over the serial bus. In other serial bus configurations, multiple devices can operate as the controlling device and one device serves as the controlling device for each transaction conducted over the serial bus. The controlling device may provide a common clock signal that is transmitted over a conventional two-wire serial bus. The controlling device may provide control signaling that identifies a type of transaction to be conducted over a conventional two-wire serial bus. During certain transactions, a controlling device may transmit commands directed to one or more receiving devices using address information provided in or with the commands. The receiving devices may be referred to as a subordinate device, a client device, a slave device, a peripheral device or another term favored by standards defining the protocols implemented by the controlling device. For the purposes of this disclosure, a controlling device will be referred to as a host device and associated receiving devices will be referred to as subordinate devices.

Overview

Devices that include multiple SoC and other IC devices often employ a shared communication interface that may include a serial bus or other data communication link to connect processors with modems and other peripherals. The serial bus or other data communication link may be operated in accordance with multiple standards or protocols. For example, the serial bus may be operated in accordance with an I2C, I3C, SPMI, and/or RFFE protocol, or another protocol that may be configured for half-duplex operation. Increased functionality and complexity of operations involving devices coupled to serial buses, together with the imposition of more stringent timing constraints in support of applications, peripherals and sensors can result in greater demand on general-purpose input/output (GPIO) pin availability and communication link throughput.

Certain aspects of the disclosure relate to techniques for communication over a 1-wire serial bus, using Manchester encoding and synchronization signaling that may be used by a subordinate device to generate a rate matched clock signal. In one example, a subordinate device configured in accordance with certain aspects of this disclosure may configure a counter to count transitions in a locally generated clock signal when a Manchester-encoded data signal is received from a 1-wire serial bus. The subordinate device may configure a latch to capture an output of the counter and to provide a latched output representative of the transitions counted in the locally generated clock signal while a synchronization pattern is received in the data signal. A comparator in the subordinate device may be configured to drive a decision signal to a first signaling state when the output of the counter matches the latched output and drive the decision signal to a second signaling state when the output of the counter does not match the latched output. The decision signal may be provided to a clock input of a flipflop and transitions in the decision signal may toggle an output of the flipflop. That is, the output of the flipflop may change signaling state in response to an edge in the decision signal. The counter may be reset when the decision signal is driven to the first signaling state. The synchronization pulses may be provided using two or more Manchester-encoded data bit transmissions.

Certain aspects disclosed herein provide protocols that may replace or supplement a serial bus protocol, such as an I2C, I3C, SPMI, and/or RFFE protocol. Certain aspects are applicable to a serial bus operated in half-duplex mode or full-duplex mode. Certain aspects are applicable to point-to-point Universal Asynchronous Receiver/Transmitter (UART) interfaces, Line-Multiplexed UART (LM-UART) interfaces, or another type of point-to-point interface. In some implementations, certain aspects disclosed herein may be deployed to support exchange of virtual GPIO (VGI) messages, which can be used to communicate the state or change in state of physical GPIO pins without physical connections between devices. Certain aspects are applicable to multipoint interfaces, point-to-point interfaces, or interfaces switchable between point-to-point and multipoint modes.

Examples of Apparatus That Employ Serial Data Links

According to certain aspects of the disclosure, a serial data link may be used to interconnect electronic devices that are subcomponents of an apparatus such as a cellular phone, a smart phone, a session initiation protocol (SIP) phone, a laptop, a notebook, a netbook, a smartbook, a personal digital assistant (PDA), a satellite radio, a global positioning system (GPS) device, a smart home device, intelligent lighting, a multimedia device, a video device, a digital audio player (e.g., MP3 player), a camera, a game console, an entertainment device, a vehicle component, a wearable computing device (e.g., a smart watch, a health or fitness tracker, eyewear, etc.), an appliance, a sensor, a security device, a vending machine, a smart meter, a drone, a multicopter, or any other similar functioning device.

FIG. 1 illustrates an example of an apparatus 100 that may employ a data communication bus. The apparatus 100 may include a processing circuit 102 having multiple circuits or devices 104, 106 and/or 108, which may be implemented in one or more ASICs or in an SoC. In one example, the apparatus 100 may be a communication device and the processing circuit 102 may include a processing device provided in an ASIC 104, one or more peripheral devices 106, and a transceiver 108 that enables the apparatus to communicate through an antenna 124 with a radio access network, a core access network, the Internet and/or another network.

The ASIC 104 may have one or more processors 112, one or more modems 110, on-board memory 114, a bus interface circuit 116 and/or other logic circuits or functions. The processing circuit 102 may be controlled by an operating system that may provide an application programming interface (API) layer that enables the one or more processors 112 to execute software modules residing in the on-board memory 114 or other processor-readable storage 122 provided on the processing circuit 102. The software modules may include instructions and data stored in the on-board memory 114 or processor-readable storage 122. The ASIC 104 may access its on-board memory 114, the processor-readable storage 122, and/or storage external to the processing circuit 102. The on-board memory 114, the processor-readable storage 122 may include read-only memory (ROM) or random-access memory (RAM), electrically erasable programmable ROM (EEPROM), flash cards, or any memory device that can be used in processing systems and computing platforms. The processing circuit 102 may include, implement, or have access to a local database or other parameter storage that can maintain operational parameters and other information used to configure and operate the apparatus 100 and/or the processing circuit 102. The local database may be implemented using registers, a database module, flash memory, magnetic media, EEPROM, soft or hard disk, or the like. The processing circuit 102 may also be operably coupled to external devices such as the antenna 124, a display 126, operator controls, such as switches or buttons 128, 130 and/or an integrated or external keypad 132, among other components. A user interface module may be configured to operate with the display 126, external keypad 132, etc. through a dedicated communication link or through one or more serial data interconnects.

The processing circuit 102 may provide one or more buses 118a, 118b, 120 that enable certain devices 104, 106, and/or 108 to communicate. In one example, the ASIC 104 may include a bus interface circuit 116 that includes a combination of circuits, counters, timers, control logic and other configurable circuits or modules. In one example, the bus interface circuit 116 may be configured to operate in accordance with communication specifications or protocols. The processing circuit 102 may include or control a power management function that configures and manages the operation of the apparatus 100.

Figure 2:
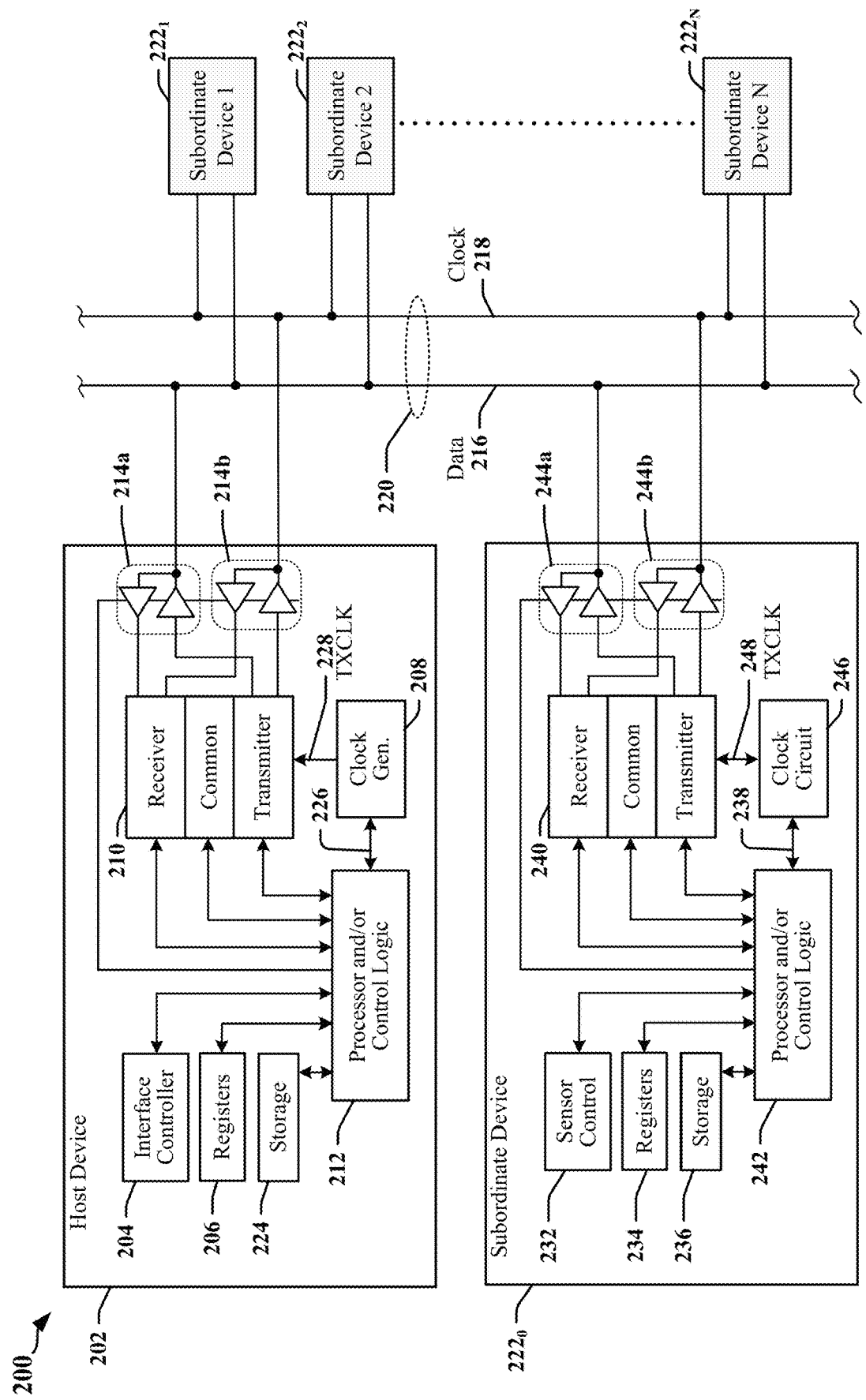
FIG. 2 illustrates a first example of an apparatus employing a data link that may be used to communicatively couple two or more devices.

FIG. 2 illustrates a first example of an apparatus 200 employing a data link that may be used to communicatively couple two or more devices. Here, the apparatus 200 includes multiple devices 202, and $222_0$-$222_N$ coupled to a two-wire serial bus 220. The devices 202 and $222_0$-$222_N$ may be implemented in one or more semiconductor IC devices, such as an application processor, SoC or ASIC. In various implementations certain of the devices 202 and $222_0$-$222_N$ may include, support or operate as a modem, a signal processing device, a display driver, a camera, a user interface, a sensor, a sensor controller, a media player, a transceiver, and/or other such components or devices. In some examples, one or more devices $222_0$-$222_N$ may be used to control, manage or monitor a sensor device. Communication between devices 202 and $222_0$-$222_N$ over the serial bus 220 is controlled by a host device 202. Certain types of bus can support multiple host devices 202.

In one example, a host device 202 may include an interface controller 204 that may manage access to the serial bus, configure dynamic addresses for subordinate devices and/or generate a clock signal 228 to be transmitted on a clock line 218 of the serial bus 220. The host device 202 may include configuration registers 206 or other storage 224, and other control logic 212 configured to handle protocols and/or higher-level functions. The control logic 212 may include a processing circuit such as a state machine, sequencer, signal processor or general-purpose processor. The host device 202 includes a transceiver 210 and line drivers/receivers 214a and 214b. The transceiver 210 may include receiver, transmitter and common circuits, where the common circuits may include timing, logic and storage circuits and/or devices. In one example, the transmitter encodes and transmits data based on timing in the clock signal 228 provided by a clock generation circuit 208. Other timing clocks 226 may be used by the control logic 212 and other functions, circuits or modules.

One or more devices $222_0$-$222_N$ may be configured to operate as a subordinate device. In some examples, a subordinate device may include circuits and modules that support a display, an image sensor, and/or circuits and modules that control and communicate with one or more sensors that measure environmental conditions. In one example, a device $222_0$ configured to operate as a subordinate device may provide a control function, module or circuit 232 that includes circuits and modules to support a display, an image sensor, and/or circuits and modules that control and communicate with one or more sensors that measure environmental conditions. In this example, the device $222_0$ can include configuration registers 234 or other storage 236, control logic 242, a transceiver 240 and line drivers/receivers 244a and 244b. The control logic 242 may include a processing circuit such as a state machine, sequencer, signal processor or general-purpose processor. The transceiver 240 may include receiver, transmitter and common circuits, where the common circuits may include timing, logic and storage circuits and/or devices. In one example, the transmitter encodes and transmits data based on timing in a clock signal 248 provided by clock generation and/or recovery circuits 246. In some instances, the clock signal 248 may be derived from a signal received from the clock line 218. Other timing clocks 238 may be used by the control logic 242 and other functions, circuits or modules.

The serial bus 220 may be operated in accordance with RFFE, I2C, I3C, SPMI, or other protocols. At least one of the devices 202 and $222_0$-$222_N$ may be configured to operate as a host device and a subordinate device on the serial bus 220. Two or more of the devices 202 and $222_0$-$222_N$ may be configured to operate as a host device on the serial bus 220. The protocol selected to control operation of the serial bus 220 may define direct current (DC) characteristics affecting certain signal levels associated with the serial bus 220, and/or alternating current (AC) characteristics affecting certain timing aspects of signals transmitted on the serial bus 220. In various examples, a 2-wire serial bus 220 transmits data on a data line 216 and a clock signal on the clock line 218. In some instances, data may be encoded in the signaling state, or transitions in signaling state of the data line 216 and the clock line 218.

Figure 3:
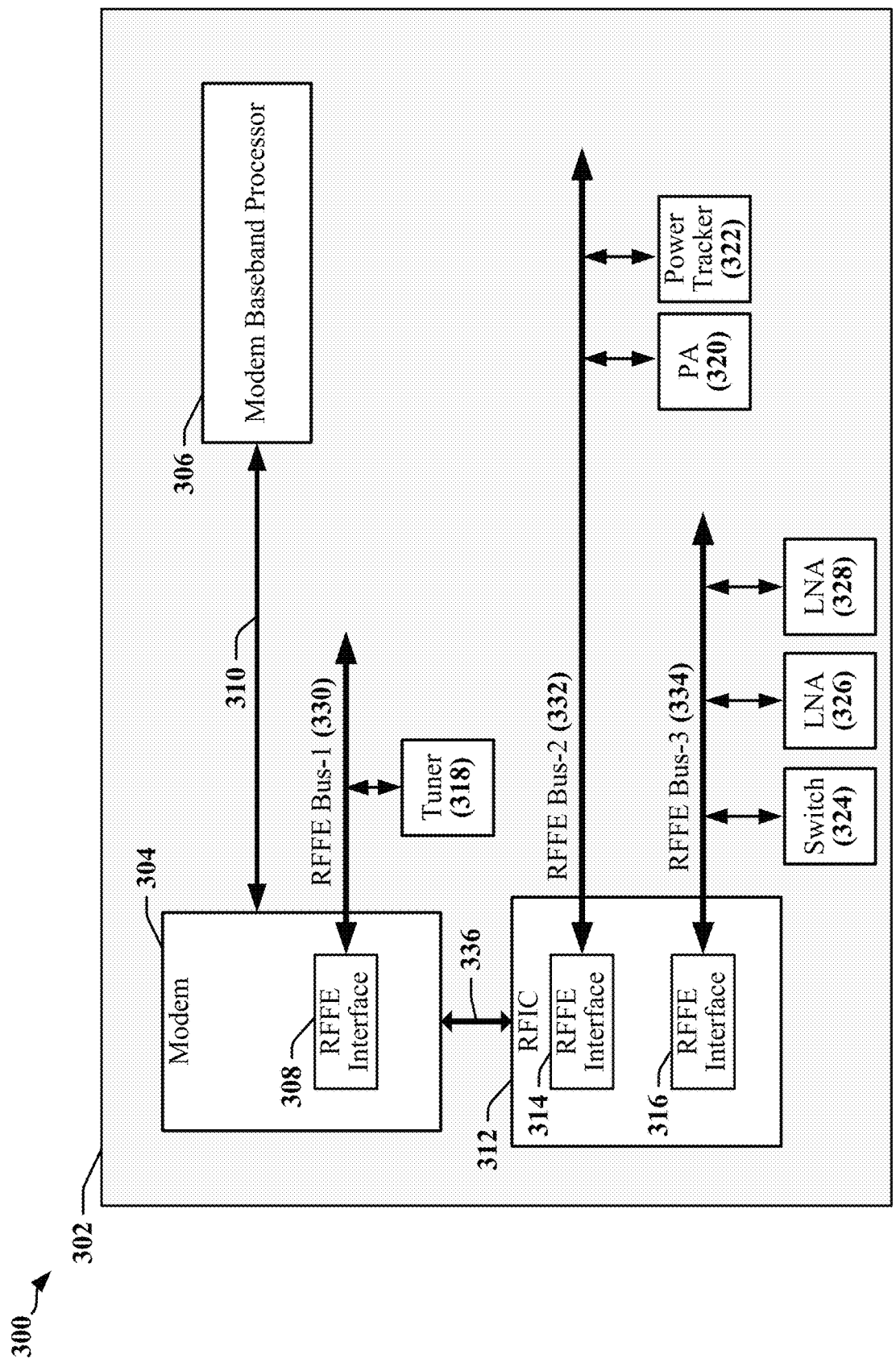
FIG. 3 illustrates a second example of an apparatus employing data links that may be used to communicatively couple two or more devices, including various radio frequency front-end devices.

FIG. 3 illustrates a second example of an apparatus 300 employing data links that may be used to communicatively couple two or more devices. In this example, a chipset or device 302 employs multiple RFFE buses 330, 332, 334 to couple various RF front-end devices 318, 320, 322, 324, 326, 328. A modem 304 includes an RFFE interface 308 that couples the modem 304 to a first RFFE bus 330. The modem 304 may communicate with a baseband processor 306 and a Radio-Frequency IC (RFIC 312) through one or more communication links 310, 336. The illustrated device 302 may be embodied in one or more of a mobile communication device, a mobile telephone, a mobile computing system, a notebook computer, a tablet computing device, a media player, a gaming device, a wearable computing and/or communication device, an appliance, or the like.

In various examples, the device 302 may be implemented with one or more baseband processors 306, modems 304, RFICs 312, multiple communication links 310, 336, multiple RFFE buses 330, 332, 334 and/or other types of buses. The device 302 may include other processors, circuits, modules and may be configured for various operations and/or different functionalities. In the example illustrated in FIG. 3, the Modem is coupled to an RF tuner 318 through its RFFE interface 308 and the first RFFE bus 330. The RFIC 312 may include one or more RFFE interfaces 314, 316, controllers, state machines and/or processors that configure and control certain aspects of the RF front-end. The RFIC 312 may communicate with a PA 320 and a power tracking module 322 through a first of its RFFE interfaces 314 and a second RFFE bus 332. The RFIC 312 may communicate with a switch 324 and one or more LNAs 326, 328 through a second of its RFFE interfaces 316 and a third RFFE bus 334.

Bus latency can affect the ability of a serial bus to handle high-priority, real-time and/or other time-constrained messages. Low-latency messages, or messages requiring low bus latency, may relate to sensor status, device-generated real-time events and virtualized GPIO state. In one example, bus latency may be measured as the time elapsed between a message becoming available for transmission and the delivery of the message or, in some instances, commencement of transmission of the message. Other measures of bus latency may be employed. Bus latency typically includes delays incurred while higher priority messages are transmitted, interrupt processing, the time required to terminate a datagram in process on the serial bus, the time to transmit commands causing bus turnaround between transmit mode and receive mode, bus arbitration and/or command transmissions specified by protocol.

In certain examples, latency-sensitive messages may include coexistence messages. Coexistence messages are transmitted in a multisystem platform to prevent or reduce instances of certain device types impinging on each other, including for example, switches 324, LNAs 326, 328, PAs 320 and other types of devices that operate concurrently in a manner that can generate inter-device interference, or that could potentially cause damage to one or more devices. Devices that may interfere with one another may exchange coexistence management (CxM) messages to permit each device to signal imminent actions that may result in interference or conflict. CxM messages may be used to manage operation of shared components including a switch 324, LNA 326, 328, PA 320 and/or an antenna.

Multi-drop interfaces such as RFFE, SPMI, I3C, etc. can reduce the number of physical input/output (I/O) pins used to communicate between multiple devices. Protocols that support communication over a multi-drop serial bus define a datagram structure used to transmit command, control and data payloads. Datagram structures for different protocols define certain common features, including addressing used to select devices to receive or transmit data, clock generation and management, interrupt processing and device priorities. In this disclosure, the example of RFFE protocols may be employed to illustrate certain aspects disclosed herein. However, the concepts disclosed herein are applicable to other serial bus protocols and standards.

Figure 4:
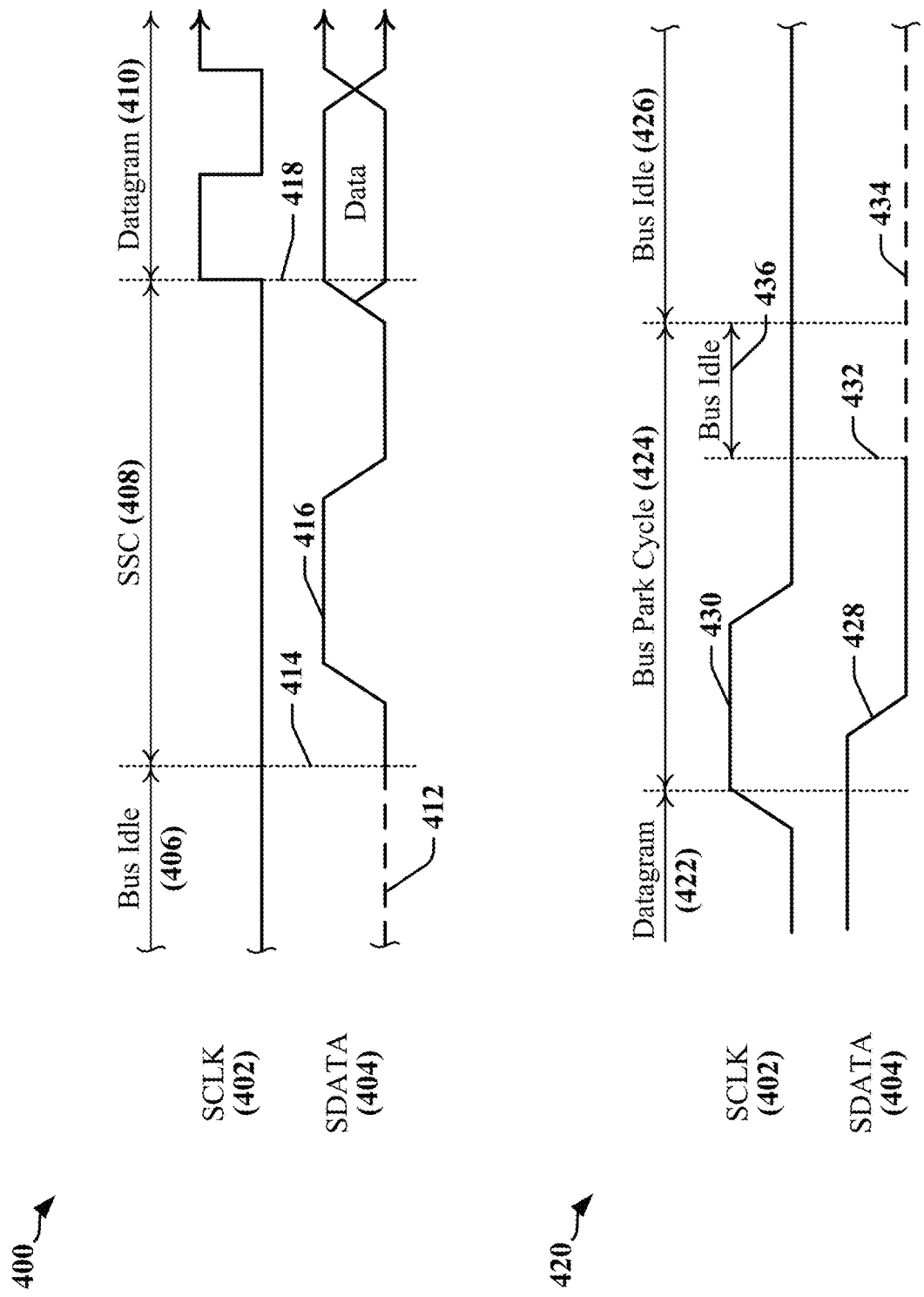
FIG. 4 includes timing diagrams that illustrate signaling transmitted to delineate the boundaries of RFFE and SPMI datagrams.

FIG. 4 includes timing diagrams 400, 420 that illustrate signaling that is transmitted to delineate the boundaries of datagrams transmitted in accordance with RFFE protocols. The timing diagrams 400, 420 show the relative timing of signals transmitted on a 2-wire serial bus that provides a clock signal on SCLK 402 and provides for exchange of data over SDATA 404. The first timing diagram 400 illustrates timing of a sequence start condition (SSC 408) that is transmitted to signal the start of a transaction such as the transmission of a datagram 410. The SSC 408 is transmitted when the serial bus is in an idle state 406. In the idle state 406, SCLK 402 is driven at full strength by a host device while subordinate devices coupled to the serial bus present a high impedance to SCLK 402. SCLK 402 is held in the low signaling state (here, at zero volts) by the host device. In the idle state 406, SDATA 404 is weakly driven by the host device or is held in the weakly driven low signaling state 412 using a keeper circuit or a weak pull-down circuit. A keeper circuit or a weak pull-down circuit may maintain the signaling state of SDATA 404, for example, when the host device has caused its line driver to enter a high impedance state and when no other device is driving SDATA 404. The weakly driven low signaling state 412 can easily be overcome by another line driver that can drive SDATA 404 at full strength.

In a master-driven SSC 408, the host device commences transmission of the SSC 408 at a first point in time 414 when it begins to drive SDATA 404 at full strength, initially at the low signaling state. The host device then provides a pulse 416 on SDATA 404 while continuing to drive SCLK 402 to the low signaling state. The pulse 416 has duration of at least one cycle of a clock signal provided on SCLK 402 during transmission of a datagram 410. At a second point in time 418, the host device commences transmission of clock pulses on SCLK 402, thereby providing the clock signal used to control or indicate timing of a datagram 410 transmitted on SDATA 404.

The second timing diagram 420 illustrates timing of a bus park cycle (the BPC 424) that may be transmitted to signal the termination of a datagram 422, for example. The BPC 424 is transmitted by providing a falling edge 428 on SDATA 404 while SCLK 402 is in a high signaling state 430. By protocol, transitions on SDATA 404 during transmission of the datagram 422 are permitted only while the clock signal is in the low signaling state, and the falling edge 428 that occurs while SCLK 402 is in the high signaling state 430 is interpreted as control signaling (i.e., the BPC 424). The falling edge 428 is provided by the host device driving SDATA 404 low at full strength. The host device then drives SCLK 402 low and continues to drive SCLK 402 at full strength through subsequent bus idle intervals 426, 436. After driving SCLK 402 low, the host device initiates a bus idle interval 436 at a time 432 when the host device causes its line driver to enter the high impedance state. While no other device is driving SDATA 404, SDATA 404 remains in the weakly driven low signaling state 434. The BPC 424 is terminated and the serial bus enters a bus idle interval 426 until the next datagram is ready for transmission.

Figure 5:
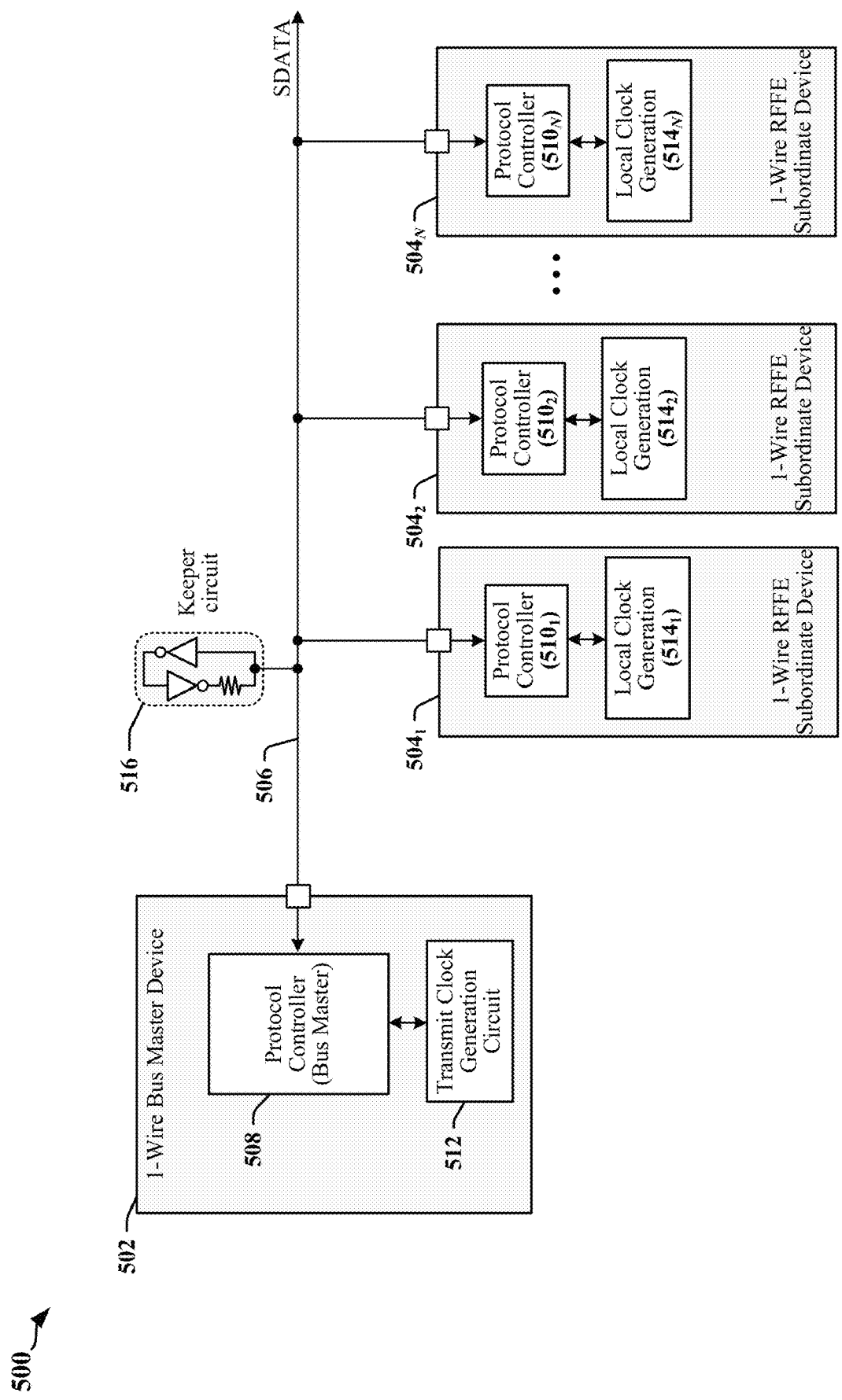
FIG. 5 illustrates a system in which a host device communicates with one or more one-wire subordinate devices in accordance with certain aspects disclosed herein.

FIG. 5 illustrates a system 500 in which a host device 502 communicates with one or more one-wire subordinate devices $504_1$-$504_N$ in accordance with certain aspects disclosed herein. The host device 502 may be provided in an RFIC, modem, application processor or another type of device. The host device 502 may be adapted to exchange data with the one-wire subordinate devices $504_1$-$504_N$ over a single wire, referred to as the SDATA line 506 in the illustrated system 500. Data is encoded in a signal transmitted over the SDATA line 506, where the signal includes embedded clock information that can be used by the receiving device to decode data from the signal.

The host device 502 and the one-wire subordinate devices $504_1$-$504_N$ typically include respective protocol controllers 508, $510_1$-$510_N$. The protocol controllers 508, $510_1$-$510_N$ may comprise a processor, controller, state machine or other logic circuits configured to support one or more protocols. The protocol controller 508 in the host device 502 may be further configured to manage communication over the SDATA line 506. In some instances, the protocol controller 508 performs some of the functions of a host. In some implementations, the protocol controller 508 in the host device 502 may be used to configure one or more of the one-wire subordinate devices $504_1$-$504_N$. The host device 502 may determine a configuration of a one-wire subordinate device $504_1$-$504_N$ that is a designated recipient of data to be transmitted over the SDATA line 506, and may cause the protocol controller 508 to encode data intended for the recipient one-wire subordinate device $504_1$-$504_N$ in a signal to be transmitted over the SDATA line 506 and addressed to the one-wire subordinate device $504_1$-$504_N$.

The host device 502 may include a transmit clock generator 512 that can be used to define timing for transmissions over the SDATA line 506. Each of the one-wire subordinate devices $504_1$-$504_N$ includes a local clock generation circuit $514_1$-$514_N$ that provides timing for the corresponding protocol controller $510_1$-$510_N$. The local clock generation circuits $514_1$-$514_N$ may be synchronized using synchronization pulses transmitted by the host device 502 after an SSC or transmitted by the host device 502 or by one of the one-wire subordinate devices $504_1$-$504_N$ after a line turnaround. In accordance with certain aspects of this disclosure, the local clock generation circuits $514_1$-$514_N$ may be synchronized using transitions in Manchester-encoded commands and data payloads transmitted over the SDATA line 506. The local clock generation circuits $514_1$-$514_N$ may include a ring oscillator or delay locked loop. In some implementations, the local clock generation circuits $514_1$-$514_N$ may include an injection-locked oscillator that responds to synchronizing pulses and/or the transitions in Manchester-encoded command and data payload transmissions.

A keeper circuit 516 may be coupled to the SDATA line 506 to facilitate line turnaround, in-band interrupt requests or arbitration procedures in accordance with certain aspects disclosed herein. In one example, the keeper circuit 516 may be configured as a positive feedback circuit that drives the SDATA line 506 through a high impedance output, and receives feedback from the SDATA line 506 through a low impedance input. The keeper circuit 516 may be configured to maintain the last asserted voltage on the SDATA line 506. The keeper circuit 516 can be easily overcome by an active line driver in the host device 502 or in one of the one-wire subordinate devices $504_1$-$504_N$.

Conventional implementations of 1-wire bidirectional communication buses have been hampered by restrictively slow data rates. Many conventional 1-wire bidirectional communication buses are limited to sub-megahertz (MHZ) signaling rates and are unsuited to high-speed RF-Front End control applications which can require clock rates of up to 52

MHZ. Some conventional 1-wire bidirectional communication buses attempt to increase data rates through the use of pulse-width modulation and other data encoding schemes. However, these latter communication buses are typically unable to obtain signaling rates greater than 4 MHz due to various limitations with PWM signaling, for example.

A 1-wire bidirectional communication bus implemented in accordance with certain aspects disclosed herein can achieve data rates of up to and beyond 52 MHZ. In certain examples, a signaling scheme provided for communication over 1-wire communication buses uses a combination of RFFE protocols, Manchester encoding and modified control signaling that can indicate and distinguish between various types of transactions.

Figure 6:
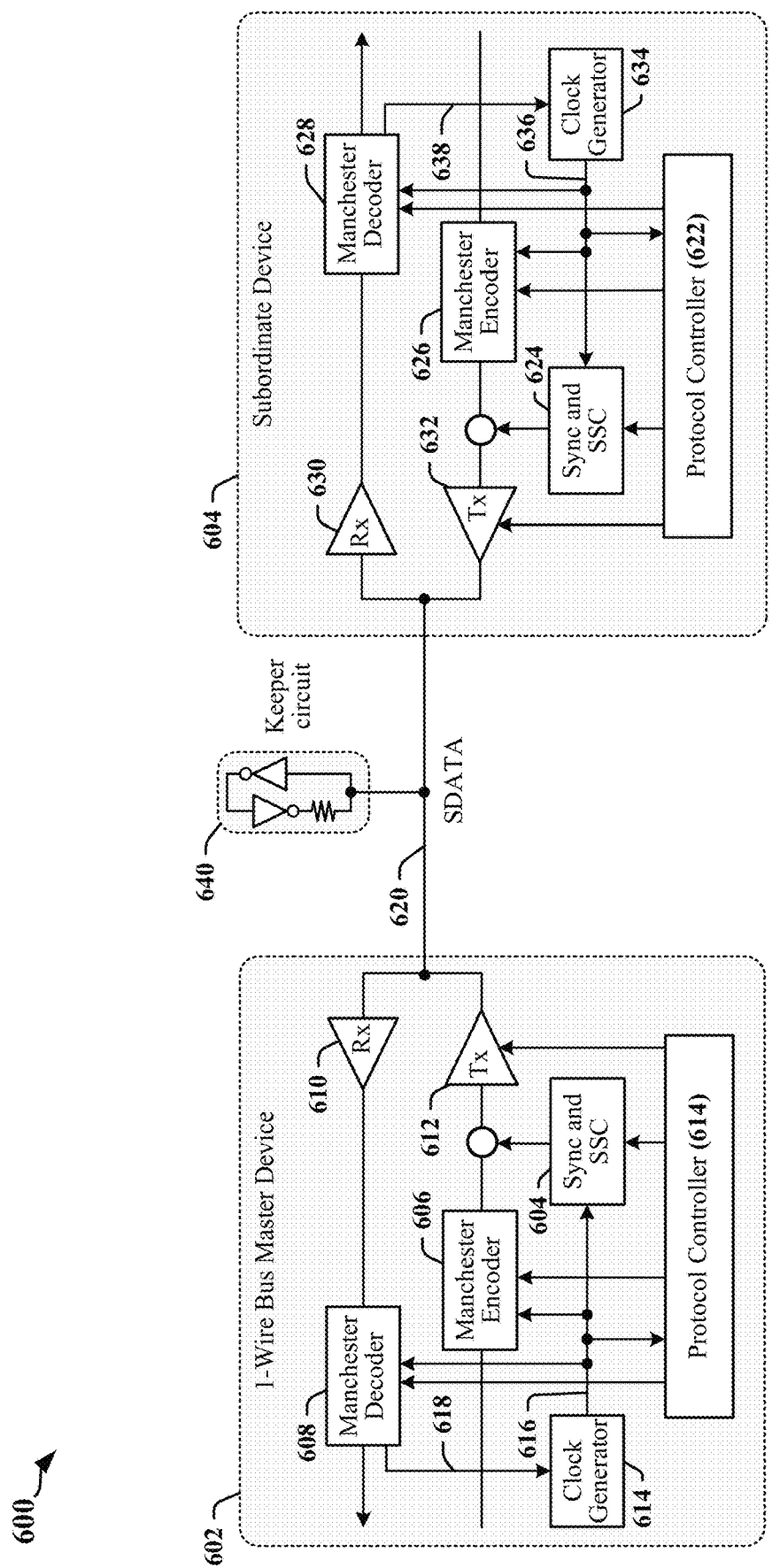
FIG. 6 illustrates an example of a 1-wire serial interface that may be configured in accordance with certain aspects of this disclosure.

FIG. 6 illustrates an example of a 1-wire serial interface 600 that may be configured in accordance with certain aspects of this disclosure. In the example, a host device 602 and one-wire subordinate device 604 are illustrated. The host device 602 includes a protocol controller 614. The protocol controller 614 may be implemented using a processor, microcontroller or finite state machine and may be used to control transmit and receive functions of the host device 602. The protocol controller 614 may include or be coupled to a signal generation circuit 604 that generates synchronization and SSC signals transmitted on the SDATA line 620 that couples the host device 602 to one or more subordinate devices 604. The signal generation circuit 604 may be configured to generate different types of SSC to initiate arbitration, initiate data transfer or to abandon arbitration. The signal generation circuit 604 may be configured to generate synchronization pulses used to synchronize clock signals produced at the subordinate device 604 with a transmit clock signal generated in the host device 602.

The protocol controller 614 may be configured to selectively activate a Manchester encoder 606 and a Manchester decoder 608 based on mode of operation of the 1-wire serial interface 600. The Manchester decoder 608 may extract data and clock information from a signal received from the SDATA line 620. The protocol controller 614 may be further configured to format datagrams for transmission over the SDATA line 620. The protocol controller 614 may be further configured to generate commands to be transmitted over the SDATA line 620.

The illustrated host device 602 includes a clock generator 614 that includes one or more clock generation circuits. The clock generator 614 may be configured to generate clock signals 616 that are used during transmit and receive operations. In one example, the clock signals 616 generated by the clock generator 614 include a transmitter clock signal that is used by the Manchester encoder 606 to control the data rate for transmissions by the host device 602 over the SDATA line 620. In another example, the transmitter clock signal or a frequency-scaled version of the clock signal provided by the clock generator 614 to the signal generation circuit 604 may be used to control timing of SSCs, synchronization pulses, and other signaling transmitted by the host device 602. In another example, the clock signals 616 generated by the clock generator 614 include a receiver clock signal that is used by the Manchester decoder 608 to sample or detect transitions in signals received over the SDATA line 620. The clock generator 614 may be configured to receive an edge detection signal 618 from the Manchester decoder 608 and may use the edge detection signal 618 and/or a received Manchester-encoded signal to synchronize or calibrate edges in the receiver clock signal to certain edges in the Manchester-encoded signal.

In the illustrated example, the one-wire subordinate device 604 includes a protocol controller 622. The protocol controller 622 may be implemented using a processor, microcontroller or finite state machine and may be used to control transmit and receive functions of the one-wire subordinate device 604. The protocol controller 622 may include or be coupled to a signal generation circuit 624 that generates synchronization pulses to be transmitted when the one-wire subordinate device 604 is transmitting over the SDATA line 620. The synchronization pulses generated by the signal generation circuit 604 may be configured to synchronize clock signals produced at the host device 602 with a transmit clock signal generated in the subordinate device 604.

The protocol controller 622 may be configured to selectively activate a Manchester encoder 626 and a Manchester decoder 628 based on mode of operation of the 1-wire serial interface 600. The Manchester decoder 628 may extract data and clock information from a signal received from the SDATA line 620. The protocol controller 622 may be further configured to format datagrams for transmission over the SDATA line 620. The protocol controller 622 may be further configured to disassemble datagrams and/or respond to commands received from the SDATA line 620.

The illustrated one-wire subordinate device 604 includes a clock generator 634 that includes one or more clock generation circuits. The clock generator 634 may be configured to generate clock signals 636 that are used during transmit and receive operations. In one example, the clock signals 636 generated by the clock generator 634 include a transmitter clock signal that is used by the Manchester encoder 626 to control the data rate for transmissions by the one-wire subordinate device 604 over the SDATA line 620. In another example, the transmitter clock signal or a frequency-scaled version of the clock signal provided the clock generator 634 to the signal generation circuit 624 may be used to control timing of SSCs, synchronization pulses, and other signaling transmitted by the one-wire subordinate device 604. In another example, the clock signals 636 generated by the clock generator 634 include a receiver clock signal that is used by the Manchester decoder 628 to sample or detect transitions in signals received over the SDATA line 620. The clock generator 634 may be configured to receive an edge detection signal 638 from the Manchester decoder 628 and may use the edge detection signal 638 and/or a received Manchester-encoded signal to synchronize or calibrate edges in the receiver clock signal to certain edges in the Manchester-encoded signal.

The protocol controller 614 may be configured to manage and control the operation of a line driver 612 and a line receiver 610. The protocol controller 622 may be configured to manage and control the operation of a line driver 632 and a line receiver 630. The line drivers 612, 632 may present a high impedance to the SDATA line 620 when inactivated or disabled. For example, the output of the line driver 612 in the host device 602 may present a high impedance to the SDATA line 620 when the one-wire subordinate device 604 is configured or expected to transmit data or control signals over the SDATA line 620. The output of the line driver 632 in the one-wire subordinate device 604 is typically in the high impedance state when the host device 602 is driving the SDATA line 620.

A keeper circuit 640 coupled to the SDATA line 620 facilitates line turnaround, in-band interrupt requests and arbitration procedures in a bidirectional 1-wire serial bus. It is often desired to maintain the state of the SDATA line 620 when all devices are in high impedance mode, during line turnarounds or in arbitration procedures. Line turnaround occurs when the host device 602 transitions from transmitting to receiving or from receiving to transmitting. During arbitration procedures, the host device 602 may enter high impedance mode when the one-wire subordinate device 604 has the option to transmit and the line driver in the host device 602 may present a high impedance to the SDATA line 620 to avoid contention. The state of the SDATA line 620 may be maintained using the keeper circuit 640. In one example, the keeper circuit 640 may be configured as a positive feedback circuit that drives the SDATA line 620 through a high impedance output, and receives feedback from the SDATA line 620 through a low impedance input. The keeper circuit 640 may be configured to maintain the last asserted voltage on the SDATA line 620. The keeper circuit 640 can be easily overcome by the line drivers 612, 632 in the host device 602 and the one-wire subordinate device 604, respectively.

Figure 7:
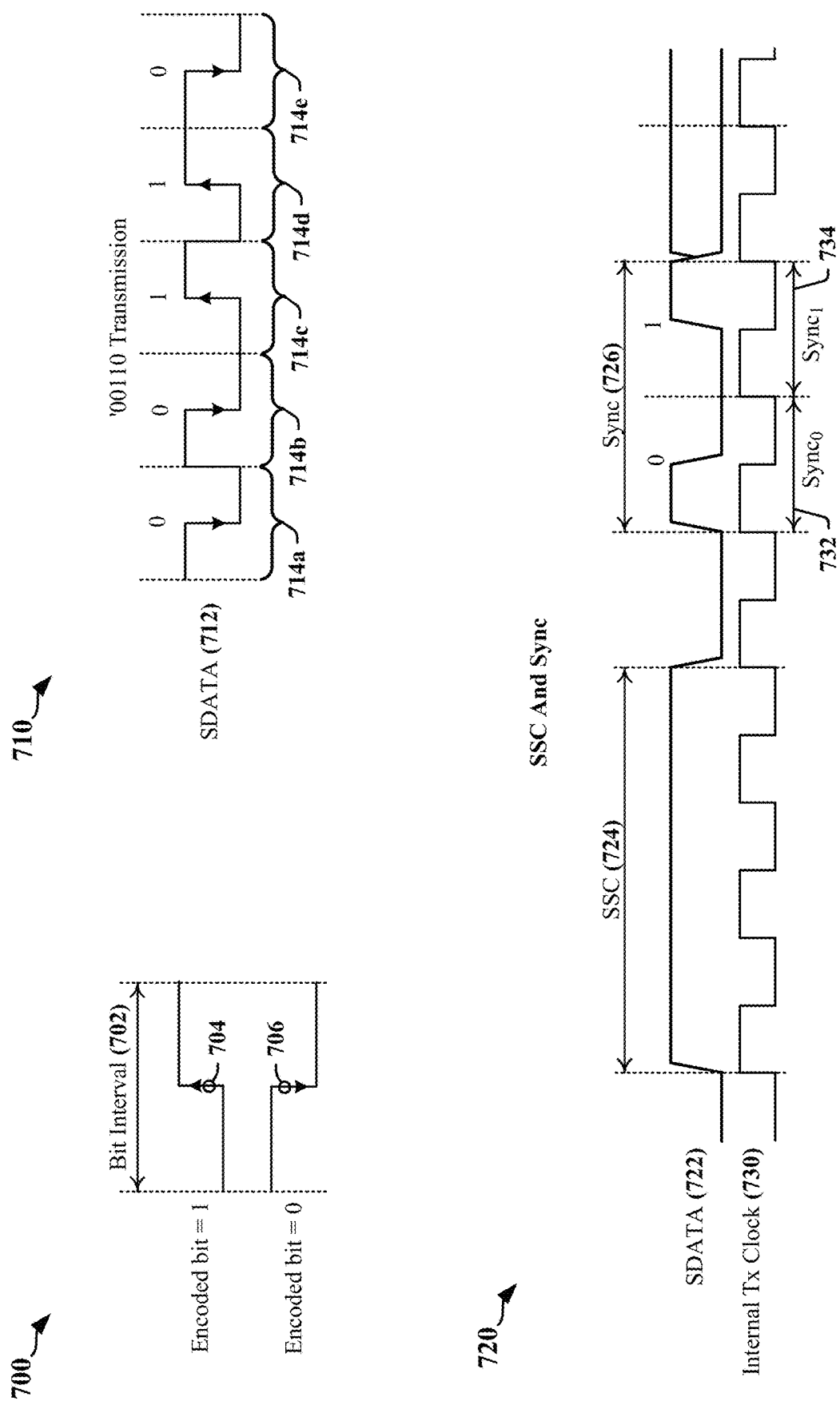
FIG. 7 illustrates certain aspects of Manchester encoding and control signaling that may be used to exchange data between a host device and one-wire subordinate devices in accordance with certain aspects of this disclosure.

FIG. 7 illustrates certain aspects of Manchester encoding and the control signaling that may be used to exchange data over a 1-wire serial bus between the host device and the one-wire subordinate devices in accordance with certain aspects of this disclosure. The signal wire of the 1-wire serial bus is referred to as SDATA 722 herein (cf. FIGS. 5 and 6). With reference to the first timing diagram 700, Manchester encoding encodes data based on the direction of a transition occurring in the middle of a bit transmission interval 702. In some implementations, SDATA 722 may be in a low state initially and a transition 704 to the high state indicates a '1' value bit. SDATA 722 may initially be in a high state and a transition 706 to the low state indicates a '0' value bit. In other implementations, the transition 704 to the high state indicates a '0' value bit, and the transition 706 to the low state indicates a '1' value bit. Clock information is embedded in the transitions of the data signal that occur within every bit transmission interval 702. Certain examples illustrated in this disclosure are based on implementations in which a transition 704 to the high state indicates a '1' value bit and a transition 706 to the low state indicates a '0' value bit.

The second timing diagram 710 illustrates five bit transmission intervals 714a-714e in a signal carried on SDATA 712. A sequence of bits {0, 0, 1, 1, 0} is transmitted in the five bit transmission intervals 714a-714e and illustrates the transitions within each of the five bit transmission intervals 714a-714e. It will be observed that transitions may occur at some boundaries between bit transmission intervals 714a-714e and that no transitions occur at the other boundaries between bit transmission intervals 714a-714c.

Control signaling provided in accordance with certain aspects of this disclosure can be used to indicate start of a datagram, clock synchronization, commencement of data exchange for both write and read datagrams, and end of a datagram. The third timing diagram 720 illustrates configuration of an SSC 724, and a synchronization pattern (Sync 726) defined for basic transactions in accordance with certain aspects of this disclosure. The SSC 724 operates as a control signal that is transmitted over SDATA 722 to signal the start of a transaction. The SSC 724 has the form of a pulse that is initiated when SDATA 722 is idle. In the illustrated example, SDATA 722 is in a low signaling state when idle. The SSC 724 is initiated by driving SDATA 722 to a high signaling state. The SSC 724 is terminated by driving SDATA 722 to the low signaling state. In the illustrated example, the SSC 724 has a duration of three cycles of an internal transmit clock signal 730 used by the host device to control timing of transmissions over the 1-wire serial bus.

In some implementations, the SSC 724 is separated from Sync 726 by a duration corresponding to one cycle of the internal transmit clock signal 730. Sync 726 has a duration defined by a number of cycles of the internal transmit clock signal 730. In the illustrated example, Sync 726 has a duration corresponding to two cycles of the internal transmit clock signal 730. Other implementations may specify a synchronization pattern that is defined by any number of cycles of the internal transmit clock signal 730, or by a minimum and/or a maximum number of cycles of the internal transmit clock signal 730.

Sync 726 includes synchronization pulses 732, 734 that are provided to enable clock generation circuits in receiving devices to synchronize with the internal transmit clock signal 730 used by the host device. Sync 726 can be encoded with a binary value. In the illustrated example, Sync 726 is transmitted as two Manchester-encoded bits having the value '01'. The synchronization pulses 732, 734 can enable clock synchronization that includes frequency and phase synchronization. The number of synchronization pulses transmitted in sequence may be configured or selected based on application, receiver capabilities or under control of an application. The number of clock ticks may be selected to achieve clock frequency and phase synchronization of different types of clock generation circuits, including ring oscillators, delay locked loops and other circuits. The use of Manchester encoding permits clock phase adjustment to be performed in each bit transmission interval and can support long run datagrams without losing clock synchronization.

In certain current implementations, a 1-wire serial bus operated according to RFFE protocols may be expected to support data rates corresponding to transmit clock frequencies of 26 MHZ and 52 MHz. In some applications, it may be desirable to implement a 1-wire serial bus that supports a range of data rates, including clock rates defined by earlier versions of the RFFE protocols. In one example, a device coupled to a 1-wire serial bus operated according to RFFE protocols may be configured to support transmit clock frequencies of 9.6 MHZ, 19.2 MHZ, 26 MHZ, 38.4 MHZ and 52 MHZ. Clock rate detection and synchronization circuits provided in accordance with certain aspects of this disclosure can enable a receiver that is coupled to the 1-wire serial bus to support a large number or range of clock frequencies. Conventional clock rate synchronizers, including synchronizers based on a phase-locked loop (PLL), can significantly increase die-area, and the power consumption necessary to implement and operate a PLL and can prove to be impracticable in cost-sensitive applications.

According to certain aspects of this disclosure, a receiver that is coupled to a 1-wire serial bus can be configured to detect clock rates by measuring time elapsed between edges in RFFE synchronization signaling. In one example, measurements obtained from a synchronization pattern (e.g., Sync 726 in FIG. 7) can be used to configure or control a clock generation circuit. In certain implementations, a clock signal provided by a local oscillator may be used by a measurement circuit to automatically determine the clock period associated with synchronization pulses transmitted over the 1-wire serial bus. The measurement circuit may produce an identifier that selects one of multiple clock gears that configure a receiver clock signal used by a Manchester decoder in the receiver. In some implementations, a measurement circuit configured to count rising edges, falling edges or both rising and falling edges of a clock signal generated by a local oscillator (the LO clock signal) can determine the duration of one or more synchronization pulses. The duration of the synchronization pulses can be determined by counting edges the LO clock signal between pairs of rising edges of the synchronization pulses, pairs of falling edges of the synchronization pulses or some combination of a rising edge and a falling edge of the synchronization pulses. The measured duration of synchronization pulses can be used to sustain clock generation at the identified transmitter clock rate based on the timing of the fixed frequency of the clock signal provided by the local oscillator.

Figure 8:
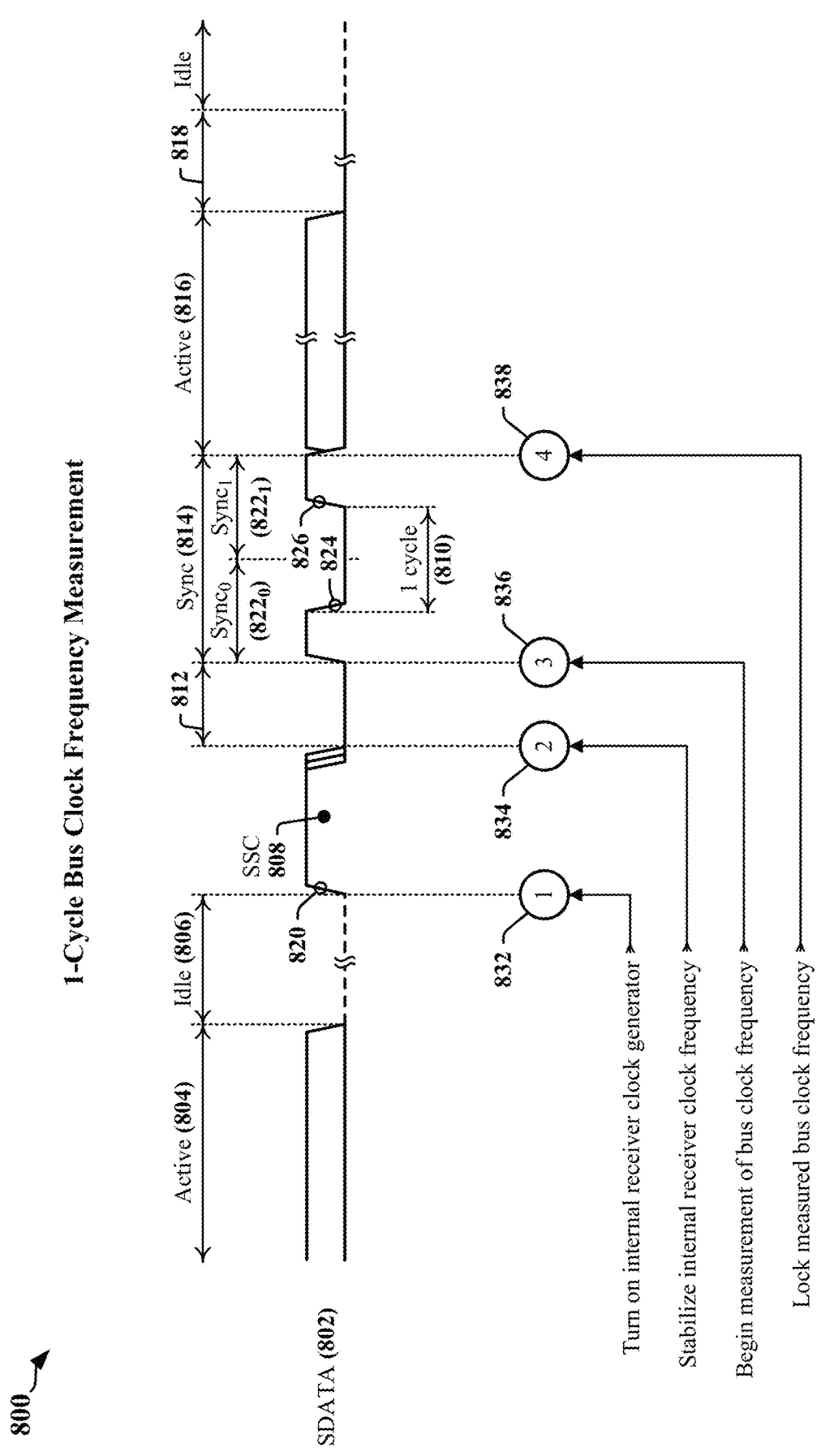
FIG. 8 illustrates certain aspects of the timing of a signal received at a 1-wire serial interface of a receiving device that is configured in accordance with certain aspects of this disclosure.

FIG. 8 illustrates certain aspects of the timing 800 of a signal received at a 1-wire serial interface of a receiving device. The 1-wire serial interface may be operated in accordance with RFFE protocols and may be configured to identify a period of the transmitter clock used to encode the signal. In the illustrated example, the signal is transmitted over the data line (here, SDATA 802) of a serial bus. Commands, data and other information may be encoded in the signal transmitted using Manchester encoding. SDATA 802 is initially in an idle state 806, after completion of a previous transaction 804 for example. At a first point in time 832, a transition 820 is detected in SDATA 802. The transition 820 corresponds to the commencement of an SSC 808 and causes the receiving device to turn on, enable, or initialize its internal clock generator. The internal clock generator may generate one or more receiver clock signals that can be used to sample or capture data from SDATA 802. The internal clock generator may include or be coupled to a local oscillator that generates an internal LO clock signal. The LO clock signal may be used to derive one or more receiver clock signals. SDATA 802 returns to a low signaling state at a second point in time 834 and remains in the low signaling state for a duration of time 812 after the SSC 808 has been terminated and before the synchronization pattern 814 is transmitted. The duration of the SSC 808 and/or the duration of time 812 may vary based on application needs. In one example, the duration of the SSC 808 and/or the duration of time 812 may be configured to provide sufficient time for the internal clock generator to attain stability before a synchronization pattern 814 is transmitted. In some implementations, the duration of the SSC 808 may be configured to select between 1-wire and 2-wire operation in when the serial bus is coupled to some combination of 1-wire and 2-wire devices.

The synchronization pattern 814 commences at a third point in time 836. The internal clock generator is expected to have attained stable operation at the beginning of the synchronization pattern 814 in order to properly detect and confirm the content of the synchronization pattern. In the illustrated example, the synchronization pattern 814 comprises a first bit that encodes a value of '0' and a second bit that encodes a value of '1'. According to certain aspects, the internal clock generator can be rate matched and/or synchronized to the edges 824, 826 occurring at respective centers of the two bits of the synchronization pattern 814.

The synchronization pattern 814 precedes a transaction that is conducted over SDATA 802. The transaction commences at a fourth point in time 838 that corresponds to the end of the synchronization pattern 814. SDATA 802 remains in an active state for a duration 816 until the transaction is completed. Upon termination of the transaction, SDATA 802 exits the active state and is driven to the low signaling state for a period of time 818 before being idled. SDATA 802 may be considered active when data, commands or control signaling is being transmitted.

According to certain aspects of this disclosure, the receiving device may measure the period of the transmitter clock signal while the synchronization pattern 814 is being transmitted. In the example illustrated in FIG. 8, the receiving device measures the period of the transmitter clock signal based on the duration of time 810 between the edges 824, 826 occurring at the center of the two bits of the synchronization pattern 814. This measured duration of time 810 nominally corresponds to one bit transmission interval. The duration of time 810 between edges 824, 826 may be measured using the LO clock signal. In certain implementations, the LO clock signal is generated with a frequency that is a multiple of the frequency of the transmitter clock signal and the duration of time 810 between edges 824, 826 may be measured by counting edges in the internal clock signal.

In one example, a counter clocked by the LO clock signal is reset at the second point in time 834, enabled for counting upon detection of a first edge 824 at the center of the first bit transmission interval $822_0$ in the synchronization pattern 814 and disabled for counting upon detection of an edge 826 at the center of the second bit transmission interval 8221 in the synchronization pattern 814. The output of the counter represents a time value that may be used to generate an index or code that indicates or controls the period of the receiver clock signals used to sample or capture data from SDATA 802. The counter value and index or code may be locked at the end of the synchronization pattern 814, which is indicated as the fourth point in time 838.

Figure 9:
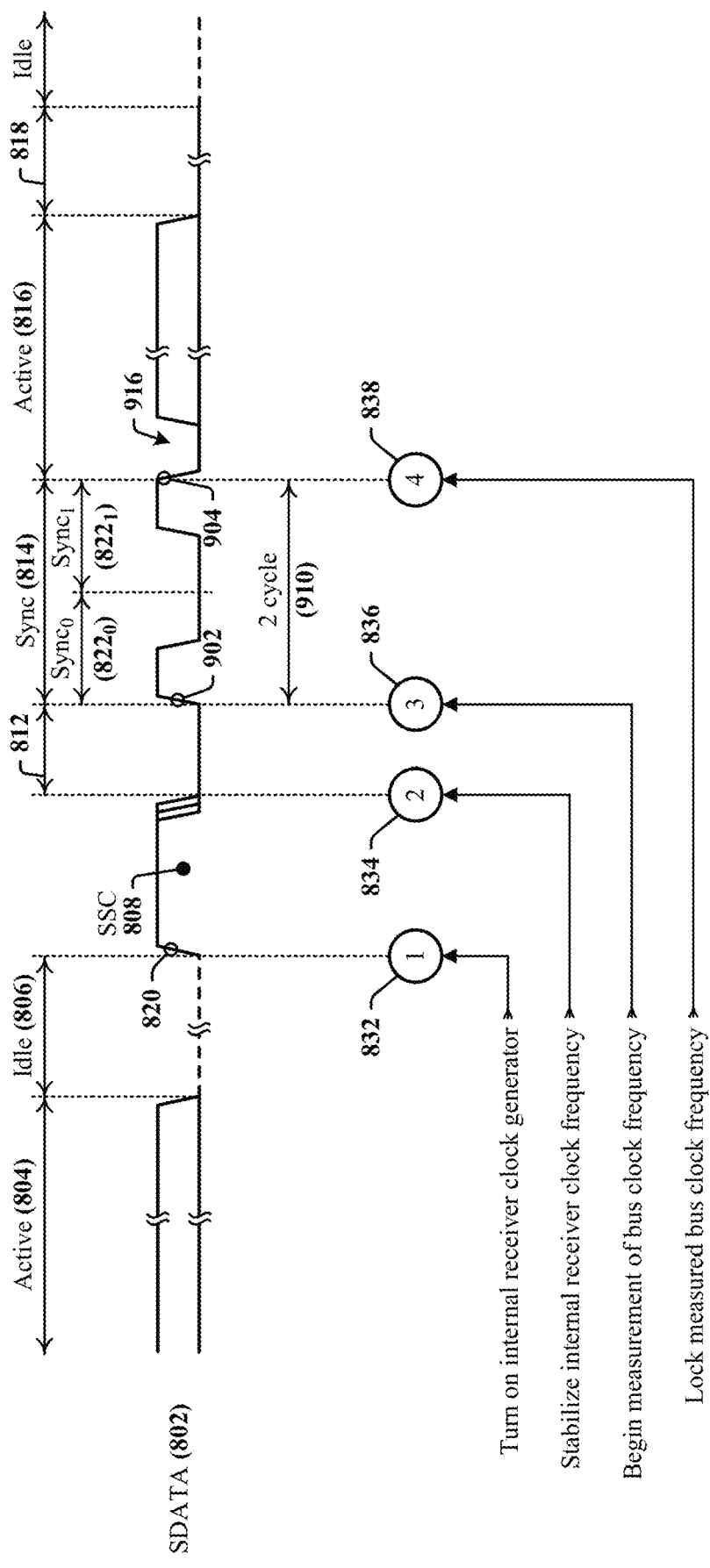
FIG. 9 illustrates certain aspects of the timing of a signal received at a 1-wire serial interface of a receiving device, when two bits of a two-bit synchronization pattern 814 is used to measure the period of the transmitter clock signal in accordance with certain aspects of this disclosure.

FIG. 9 illustrates an example of the timing 900 of a signal received at a 1-wire serial interface of a receiving device when two bits of a synchronization pattern 814 are used to measure the period of the transmitter clock signal in accordance with certain aspects of this disclosure. This example may apply when it is known that SDATA 802 will be driven to the low signaling state 916 immediately after transmission of the synchronization pattern 814. SDATA 802 may be driven to the low signaling state 916 when additional synchronization bits (not shown) are transmitted as part of the synchronization pattern 814. It may be known that SDATA 802 is to be driven to the low signaling state 916 when the first bit of the transaction following the synchronization pattern 814 has a value of '1'. Other conditions may permit the use of two bits of the synchronization pattern 814 to measure the period of the transmitter clock signal when other types or configuration of synchronization pattern 814 are used.

In the example illustrated by FIG. 9, the duration of time 910 between the edges 902, 904 occurring at the beginning and end of two bits in a synchronization pattern 814 may be measured. The duration of time 910 between edges 902, 904 nominally corresponds to two bit transmission intervals. The duration of time 910 between edges 902, 904 may be measured using the LO clock signal. In certain implementations, the LO clock signal is generated with a frequency that is a multiple of the frequency of the transmitter clock signal and the duration of time 910 between edges 902, 904 may be measured by counting edges in the LO clock signal.

In one example, a counter clocked by the LO clock signal is reset at the second point in time 834, enabled for counting upon detection of an edge 902 at the beginning of the synchronization pattern 814 and disabled for counting upon detection of an edge 904 at the end of the synchronization pattern 814. The output of the counter represents a time value that may be used to generate an index or code that indicates or controls the period of the receiver clock signals used to sample or capture data from SDATA 802. The counter value and index or code may be locked at the end of the synchronization pattern 814, indicated as the fourth point in time 838.

Figure 10:
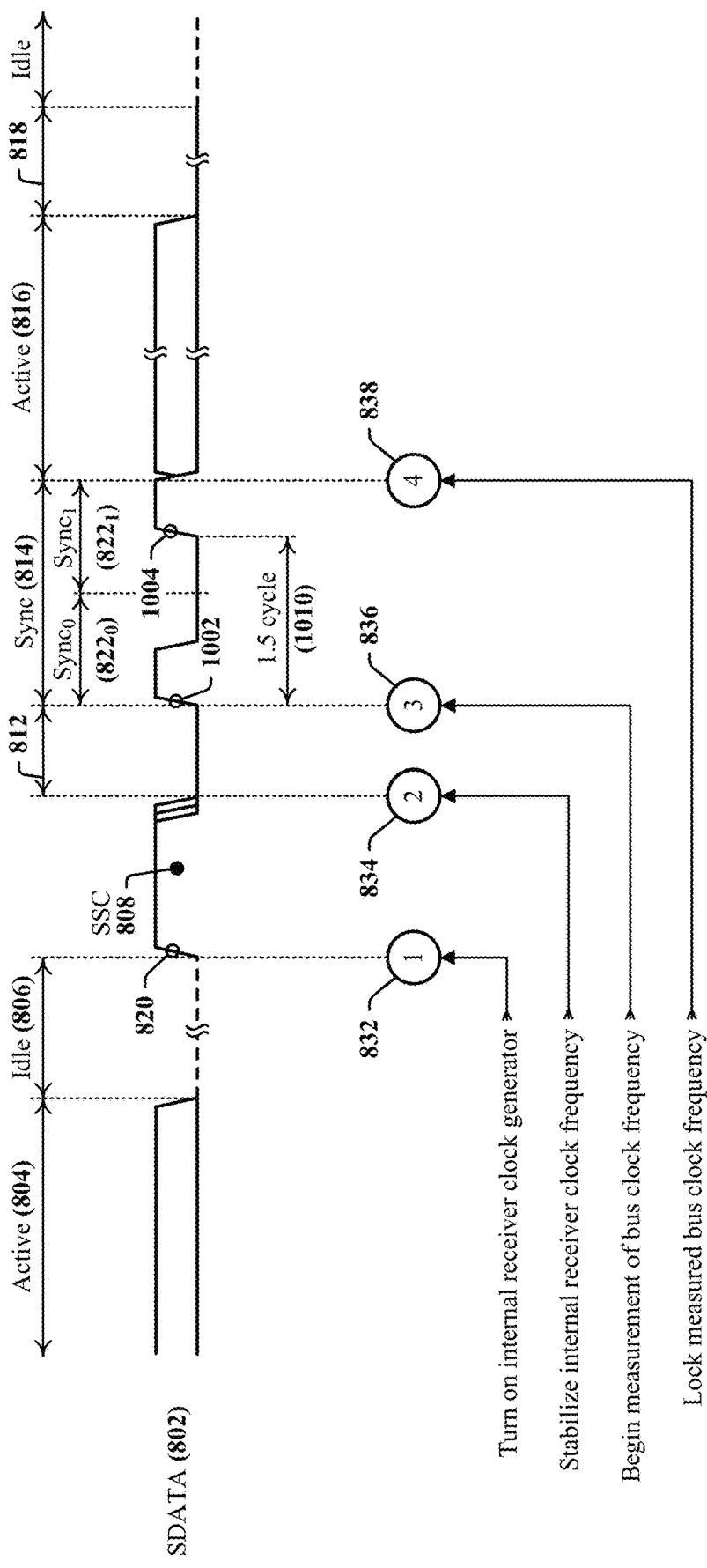
FIG. 10 illustrates a first example of the timing of a signal received at a 1-wire serial interface of a receiving device, when one and a half bits of a synchronization pattern are used to measure the period of the transmitter clock signal in accordance with certain aspects of this disclosure.

FIG. 10 illustrates a first example of the timing 1000 of a signal received at a 1-wire serial interface of a receiving device when one and a half bits of a synchronization pattern 814 are used to determine the period of the transmitter clock signal in accordance with certain aspects of this disclosure. In this example, the duration of time 1010 between the first edge 1002 and third edge 1004 of the synchronization pattern 814 may be measured. The measured duration of time 1010 nominally corresponds to one and a half bit transmission intervals. The duration of time 1010 between edges 1002 and 1004 may be measured using the LO clock signal. In certain implementations, the LO clock signal is generated with a frequency that is a multiple of the frequency of the transmitter clock signal and the duration of time 1010 between edges 1002 and 1004 may be measured by counting edges in the LO clock signal.

In one example, a counter clocked by the LO clock signal is reset at the second point in time 834, enabled for counting upon detection of the first edge 1002 at the beginning of the synchronization pattern 814 and disabled for counting upon detection of an edge 1004 occurring at the center of the second bit transmission interval 8221 in the synchronization pattern 814. The output of the counter represents a value that may be used to generate an index or code that indicates or controls the period of the receiver clock signals used to sample or capture data from SDATA 802. The counter value and index or code may be locked at the end of the synchronization pattern 814, indicated as the fourth point in time 838.

Figure 11:
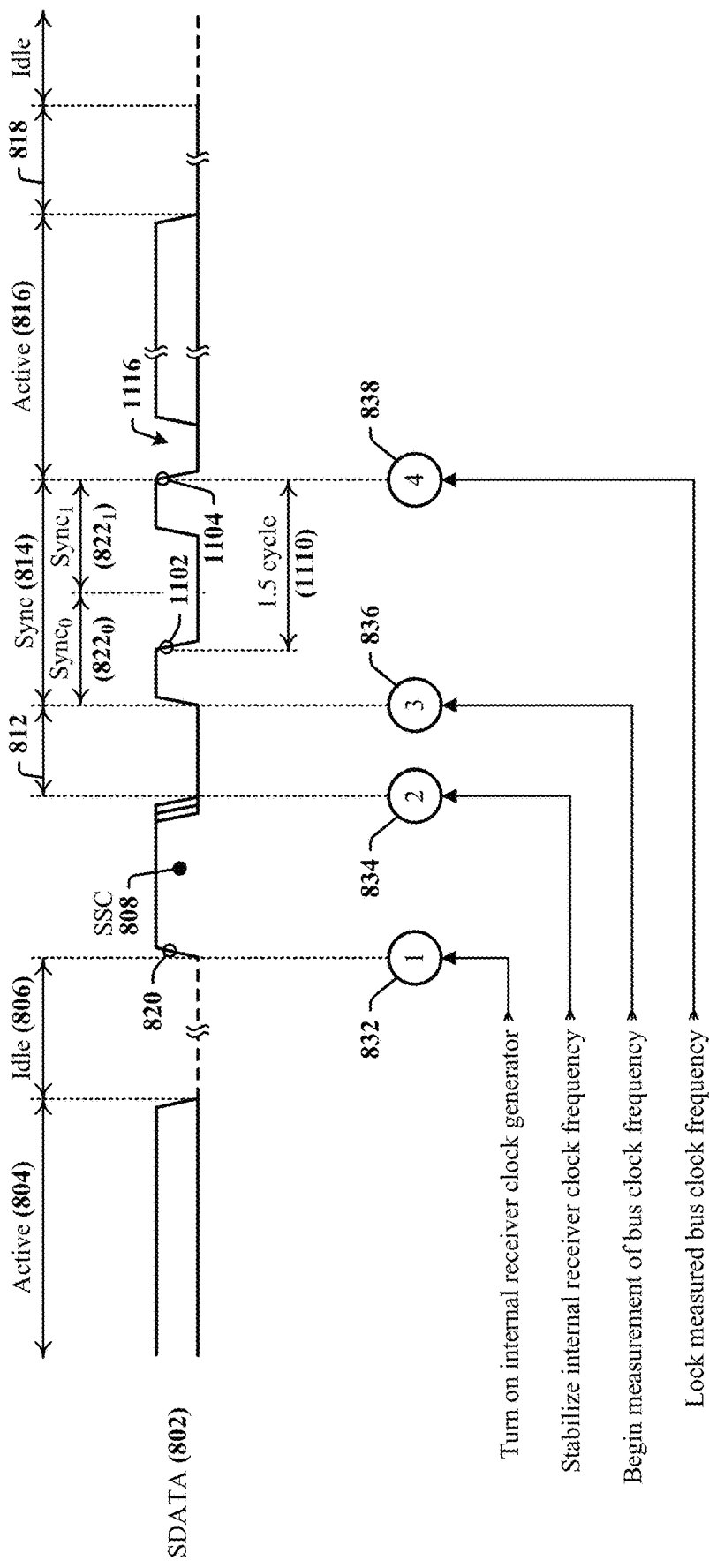
FIG. 11 illustrates a second example of the timing of a signal received at a 1-wire serial interface of a receiving device, when one and a half bits of a synchronization pattern are used to measure the period of the transmitter clock signal in accordance with certain aspects of this disclosure.

FIG. 11 illustrates a second example of the timing 1100 of a signal received at a 1-wire serial interface of a receiving device when one and a half bits of a synchronization pattern 814 are used to measure the period of the transmitter clock signal in accordance with certain aspects of this disclosure. This example may apply when it is known that SDATA 802 will be driven to the low signaling state 1116 immediately after transmission of the synchronization pattern 814. SDATA 802 may be driven to the low signaling state 1116 when additional synchronization bits (not shown) are transmitted as part of the synchronization pattern 814. It may be known that SDATA 802 is to be driven to the low signaling state 1116 when the first bit of the transaction following the synchronization pattern 814 has a value of '1'. Other conditions may permit the use of two bits of the synchronization pattern 814 to measure the period of the transmitter clock signal when other types or configuration of synchronization pattern 814 are used.

In this example, the duration of time 1110 between the second edge 1102 and last edge 1104 of a two-bit synchronization pattern 814 may be measured. The measured duration of time 1010 nominally corresponds to one and a half bit transmission intervals. The duration of time 1110 between edges 1102 and 1104 may be measured using the LO clock signal. In certain implementations, the LO clock signal is generated with a frequency that is a multiple of the frequency of the transmitter clock signal and the duration of time 1110 between edges 1102 and 1104 may be measured by counting edges in the LO clock signal.

In one example, a counter clocked by the LO clock signal is reset at the second point in time 834, enabled for counting upon detection of an edge 1102 at the center of the first bit transmission interval 8220 of the synchronization pattern 814 and disabled for counting upon detection of an edge 1104 at the end of the two-bit synchronization pattern 814.

The output of the counter represents a time value that may be used to generate an index or code that indicates or controls the period of the receiver clock signals used to sample or capture data from SDATA 802. The counter value and index or code may be locked at the end of the synchronization pattern 814, indicated as the fourth point in time 838.

Figure 12:
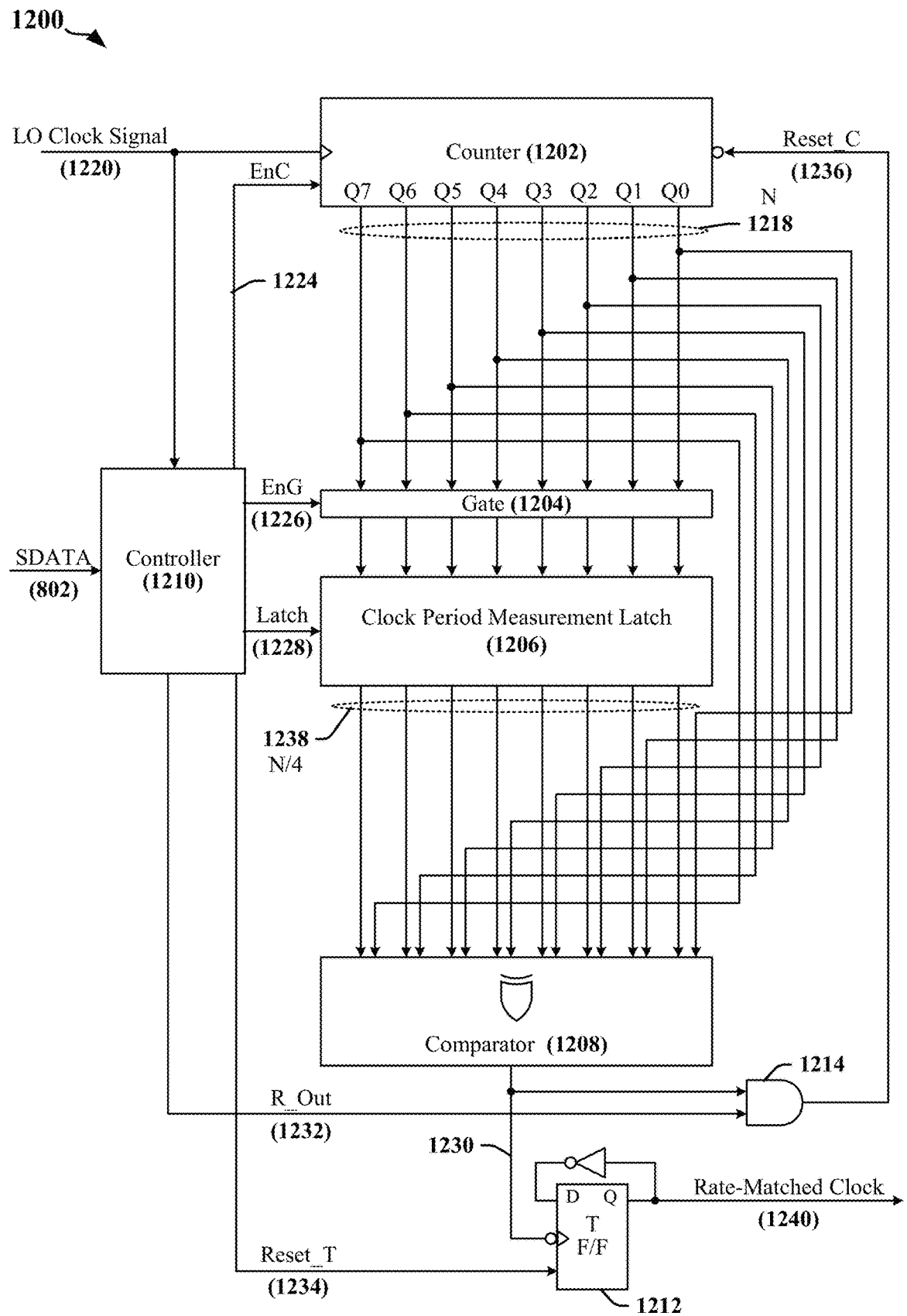
FIG. 12 illustrates an example of a rate-matched clock generation circuit configured in accordance with certain aspects of this disclosure.

FIG. 12 illustrates an example of a rate-matched clock generation circuit 1200 configured in accordance with certain aspects of this disclosure. In some implementations, the rate-matched clock can be configured to measure the period of a transmitter clock signal using the synchronization pattern 814 transmitted over a 1-wire serial bus, as illustrated in FIGS. 8-10 for example. The rate-matched clock generation circuit 1200 includes a controller 1210 that is configured to monitor, manage and control operations of a transmitter clock rate measurement circuit and a receiver clock generation circuit. The controller 1210 may be incorporated in a processing circuit and/or may include a finite state machine, microprocessor, microcontroller, digital signal processor (DSP), sequencer, combinational logic or the like. The controller 1210 may provide control signals 1224, 1226 and 1228 used to enable the operation of a counter 1202, a latch 1206 and gating circuits 1204.

In the illustrated example, the controller 1210 is configured to monitor a signal that is transmitted over the data line (SDATA 802) of a serial bus operated in accordance with RFFE protocols that have been adapted or configured for 1-wire communication. The controller 1210 may be configured to recognize SSCs and synchronization patterns transmitted over SDATA 802, including the SSC 808 and synchronization pattern 814 shown in FIGS. 8-10. With continued reference to FIG. 8, the controller 1210 may detect a transition 820 in SDATA 802 that corresponds to the commencement of an SSC 808 at a first point in time 832. In some implementations, the controller 1210 responds to the commencement of the SSC 808 by turning on, enabling or initializing a local oscillator (not shown) that provides an LO clock signal 1220. In other implementations, the local oscillator is controlled independently of the rate-matched clock generation circuit 1200 and may include a system clock signal or may be derived from a system clock signal.

The synchronization pattern 814 commences at the third point in time 836, which occurs after the SSC 808 has been terminated. The controller 1210 may be configured to measure the time elapsed between selected edges in the synchronization pattern 814. In the example illustrated in FIG. 8, the controller 1210 responds to a first edge 824 by enabling the counter 1202, the latch 1206 and configuring the gating circuits 1204. When enabled, the counter 1202 counts edges in the LO clock signal 1220. In one example, the counter 1202 counts rising edges in the LO clock signal 1220. In another example, the counter 1202 counts falling edges in the LO clock signal 1220. In some examples, the counter 1202 counts rising and falling edges in the LO clock signal 1220 in order to provide increased measurement resolution.

A counter output 1218 provided by the counter 1202 is coupled to the latch 1206 through the gating circuits 1204. The counter output 1218 may represent all or a portion of the count bits provided by the counter 1202. The number of bits provided in the counter output 1218 can be selected to reliably represent the transmitter clock frequency that is to be measured or estimated using the rate-matched clock generation circuit 1200. In one example, the frequency of the LO clock signal 1220 is greater than the transmitter clock frequency and it may be desirable to divide the counted value by a number represented by $2^M$. In the latter example, M least significant bits may be omitted from the counter output 1218. In some implementations the counter output 1218 includes all count bits provided by the counter 1202 and the gating circuits 1204 may select the bits to be coupled to the latch 1206. In some implementations, the gating circuits 1204 may include logic circuits that perform a mathematical division of the count value output by the counter 1202.

The controller 1210 may be configured to disable counting by the counter 1202 after detecting a second edge 824 in the synchronization pattern 814 and to cause the latch 1206 to capture and hold the counter output 1218 when counting is disabled. The gating circuits 1204 may be disabled after the counter output 1218 is latched. In some implementations, the latched output 1238 includes all bits of the counter output 1218. In some implementations, the latched output 1238 includes fewer bits that the number of provided in the counter output 1218. For example, the latched output 1238 may include one less bit than the counter output 1218 such that the latched output 1238 represents a value of N/2 when N represents the value of the counter output 1218. The latched output 1238 may be used to represent the duration of the period of the transmitter clock signal expressed as a number of cycles of the LO clock signal 1220 or expressed as a divided number of cycles of the LO clock signal 1220. The latched output 1238 may be used to represent a data rate associated with the signal transmitted over SDATA 802. In one example, the data rate expressed in bits per second corresponds to the frequency of the transmitter clock signal when one bit of data is encoded in each period of the transmitter clock signal.

In the illustrated example, the rate-matched clock generation circuit 1200 uses the counter 1202, a comparator 1208 a flipflop 1212, combinational logic (AND gate 1214) and the output of the latch 1206 to generate a receive clock signal used to sample or decode data from the signal transmitted over SDATA 802. For each bit interval, the counter is reset and enabled to count edges in the LO clock signal 1220. The edges counted by the counter 1202 may correspond to the edges counted during measurement of the period of the transmitter clock signal based on timing of edges in the synchronization pattern 814. Accordingly, the counter 1202 may be configured to count rising edges in the LO clock signal 1220, falling edges in the LO clock signal 1220 or both rising and falling edges in the LO clock signal 1220.

The counter output 1218 and the latched output 1238 are provided to the comparator 1208. The comparator 1208 compares the bits of the counter output 1218 with corresponding bits of the latched output 1238 and generates a decision signal 1230 that indicates that either (i) the value of the counter output 1218 matches the value of the latched output 1238 or (ii) the value of the counter output 1218 does not match the value of the latched output 1238. In the illustrated example, the comparator 1208 uses exclusive-OR logic to determine whether a match exists between the counter output 1218 and the latched output 1238. When a match exists, the decision signal 1230 is driven low, triggering the flipflop 1212 and thereby causing the output of the flipflop 1212 to switch signaling state.

The decision signal 1230 is coupled to the counter through AND gate 1214. The Reset_C signal 1236 is provided at the output of AND gate 1214 and driven low when the decision signal 1230 is driven low to signal a match between the counter output 1218 and the latched output 1238. The Reset_C signal 1236 resets the counter 1202 when in the low signaling state, thereby clearing the counter output 1218 to zero such that the counter output 1218 no longer matches the value of the latched output 1238. Accordingly, the decision signal 1230 is driven high and the output of AND gate 1214 follows the R_Out signal 1232 provided by the controller 1210. The R_Out signal 1232 is held in the high signaling state by the controller 1210 when the rate-matched clock generation circuit 1200 is actively generating a receive clock signal. Accordingly, the counter 1202 is enabled to count edges in the LO clock signal 1220 after being reset during active receive clock signal generation mode.

The controller may be configured to provide an enable signal (EnC 1224) that, in a first signaling state, enables counting by the counter 1202 during transmitter clock signal period measurement and receive clock signal generation modes. Counting is disabled when EnC 1224 is in a second signaling state, typically during idle mode and/or while an SSC 808 is being transmitted over SDATA 802. In some implementations, the counter 1202 may be used to ascertain the length and/or type of an SSC 808 being transmitted over SDATA 802.

The controller may be further configured to provide a signal (the Reset_T signal 1234) that drives the reset input of the flipflop 1212. The Reset_T signal 1234 may be used to phase align the generated receive clock with transitions and/or bit transmission intervals in the signal transmitted over SDATA 802. In the illustrated example, the output of the flipflop 1212 provides, or is used to derive the rate-matched clock signal 1240 output by the rate-matched clock generation circuit 1200. The rate-matched clock signal 1240 may be imperfectly matched to the frequency of the transmitter clock signal due to variations attributable to manufacturing process, voltage or temperature (PVT) variances for example. Mismatches in frequency or phase can be accommodated by synchronizing the rate-matched clock signal 1240 to the transitions at the center of each bit-transmission interval that are guaranteed by Manchester encoding. In some implementations, phase and frequency alignment may be performed by circuits downstream of the rate-matched clock generation circuit 1200.

In some implementations, a rate-matched clock generation circuit 1200 configured in accordance with certain aspects of this disclosure can be synchronized to the guaranteed transitions at the center of each bit-transmission interval. In one example, the controller 1210 may be configured to assert the R_Out signal 1232 in response to detection of a transition at the center of bit-transmission interval. When the transition at the center of a bit-transmission interval occurs before the decision signal 1230 is asserted (driven low), the controller may drive the R_Out signal 1232 to the low signaling state, thereby preempting match detection. When the transition at the center of a bit-transmission interval occurs after the decision signal 1230 is asserted (driven low), the controller may drive the R_Out signal 1232 to the low signaling state, thereby resetting the counter 1202 for a second time near the center of the bit-transmission interval. In some implementations, the rate-matched clock generation circuit 1200 is effectively configured such that the comparator resets the counter 1202 at the beginning of each bit-transmission interval and transition detection logic provided by the controller 1210 resets the counter 1202 in the middle of each bit-transmission interval.

Figure 13:
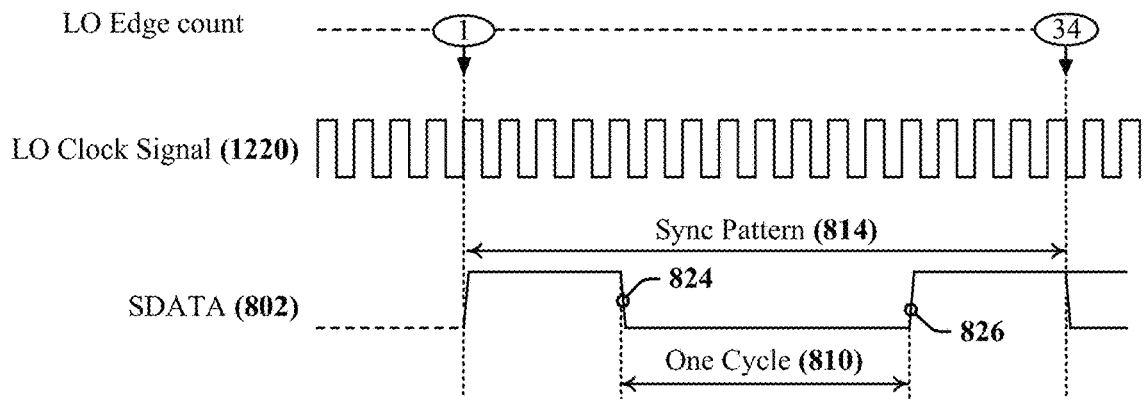
FIG. 13 illustrates certain timing aspects of the rate-matched clock generation circuit illustrated in FIG. 12.
Figure 13:
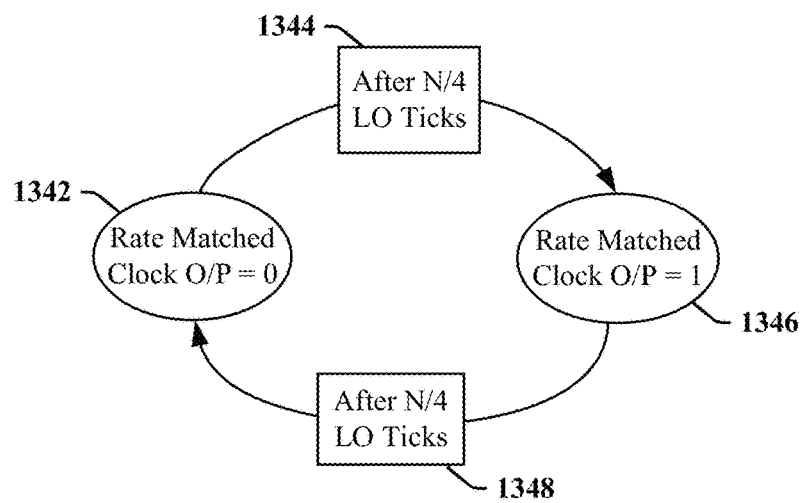

FIG. 13 illustrates certain timing aspects of the rate-matched clock generation circuit 1200 illustrated in FIG. 12. The timing diagram 1300 illustrates rate measurement when the LO clock signal 1220 has a frequency in excess of 8 times the frequency of the transmitter clock signal. In the illustrated example, the synchronization pattern 814 has a duration corresponding to two bit transmission intervals and to 16.5 cycles of the LO clock signal 1220. In one example, the counter 1202 is configured to count rising edges and falling edges in the LO clock signal 1220 and the synchronization pattern 814 has a duration corresponding to N=34 edges of the LO clock signal 1220. In obtaining a measurement corresponding to the example illustrated in FIG. 8, the counter 1202 can be expected to produce a counter output 1218 with a value of N/2=17 edges, although the counter 1202 may capture 16 edges if the phase of the transmitter clock signal and the phase of the LO clock signal 1220 are not perfectly matched. The counter output 1218 with a value of N/2 represents one transmission bit interval. When generating a receive clock signal the flipflop 1212 is toggled twice for every transmission bit interval and the latch may be configured to provide a latched output 1238 that omits the least significant bit of the counter output 1218 in order to obtain a latched output 1238 with a value of N/4. Since the omission of the least significant bit of the counter output 1218 corresponds to an integer divide by two operation, the latched output 1238 in the illustrated example is expected to have a value of 8. The counter 1202 is reset after counting 8 edges during receive clock signal generation.

The state diagram 1340 illustrates certain aspects of receive clock signal generation. The state diagram 1340 includes two states 1342, 1346 of the rate-matched clock signal 1240, which is provided at the output of the flipflop 1212 in the rate-matched clock generation circuit 1200. In a first state 1342, the rate-matched clock signal 1240 is driven, pulled or held at a low signaling level and in second state 1346, the rate-matched clock signal 1240 is driven, pulled or held at a high signaling level. Transitions 1344, 1348 between the states 1342, 1346 occur when the counter 1202 has counted 8 edges during receive clock signal generation. Transitions 1344, 1348 between the states 1342, 1346 occur repeatedly until the controller 1210 holds the R_Out signal 1232 in the low signaling state and/or disables counting by the counter 1202 using EnC 1224.

In the various examples provided herein, the example of a 1-wire serial bus is described in which data and commands are configured in accordance with an RFFE protocol. The RFFE protocol is used to illustrate certain aspects of the disclosure. The 1-wire serial bus may be operated in accordance with a different type of serial multidrop protocol, including an SPMI protocol or an I3C protocol, for example. Certain aspects of the serial multidrop protocol selected to control and manage transmissions over the 1-wire serial bus may be adapted, configured or modified to support arbitration, line turnaround and transmissions executed without an explicit clock reference such as a clock signal transmitted on a dedicated clock wire.

Examples of Processing Circuits and Methods

Figure 14:
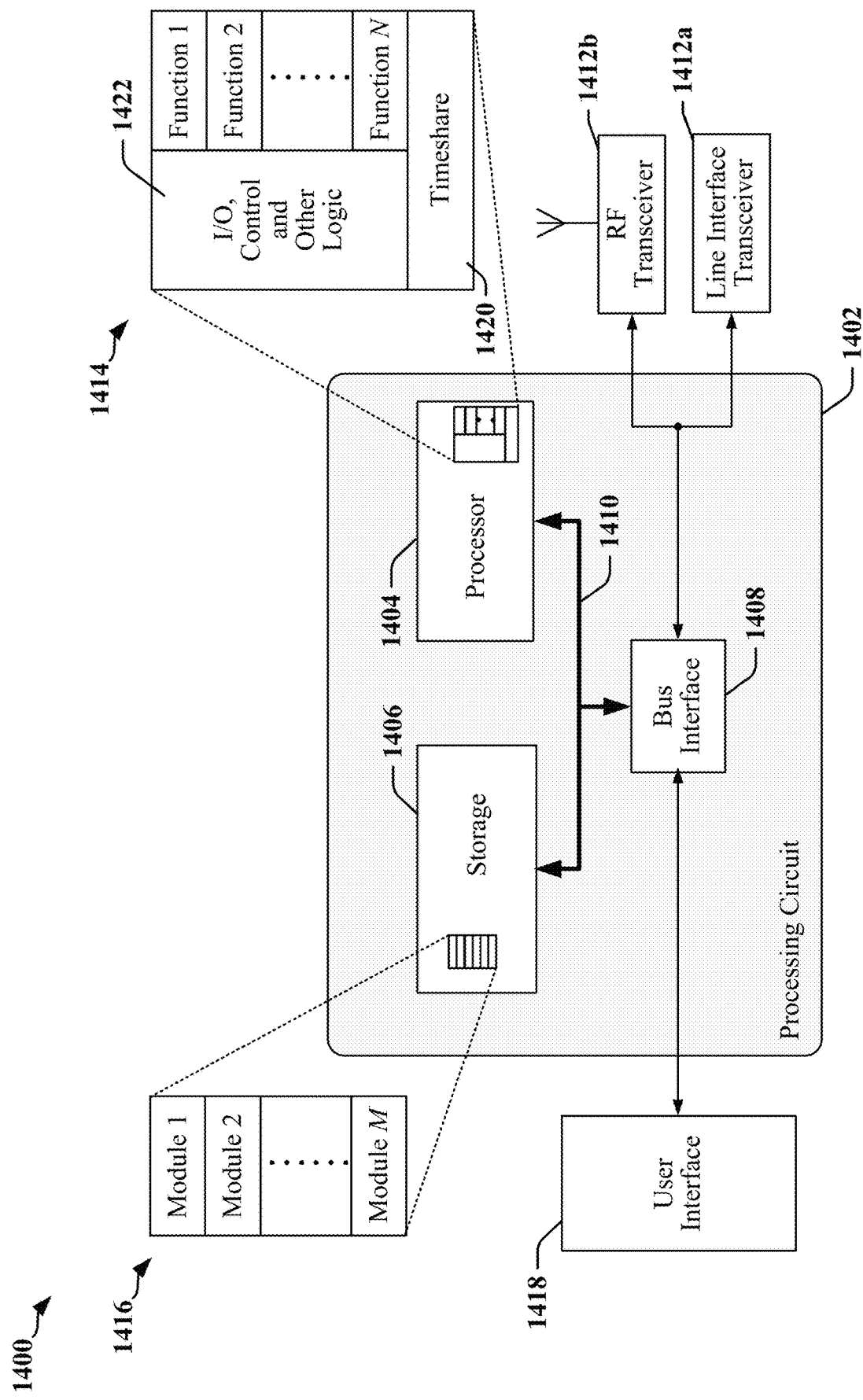
FIG. 14 illustrates one example of an apparatus employing a processing circuit that may be adapted according to certain aspects disclosed herein.

FIG. 14 is a diagram illustrating an example of a hardware implementation for an apparatus 1400. In some examples, the apparatus 1400 may perform one or more functions disclosed herein. In accordance with various aspects of the disclosure, an element, or any portion of an element, or any combination of elements as disclosed herein may be implemented using a processing circuit 1402. The processing circuit 1402 may include one or more processors 1404 that are controlled by some combination of hardware and software modules. Examples of processors 1404 include microprocessors, microcontrollers, DSPs, SoCs, ASICs, field programmable gate arrays (FPGAs), programmable logic devices (PLDs), state machines, sequencers, gated logic, discrete hardware circuits, and other suitable hardware configured to perform the various functionality described throughout this disclosure. The one or more processors 1404 may include specialized processors that perform specific functions, and that may be configured, augmented or controlled by one of the software modules 1416. The one or more processors 1404 may be configured through a combination of software modules 1416 loaded during initialization, and further configured by loading or unloading one or more software modules 1416 during operation.

In the illustrated example, the processing circuit 1402 may be implemented with a bus architecture, represented generally by the bus 1410. The bus 1410 may include any number of interconnecting buses and bridges depending on the specific application of the processing circuit 1402 and the overall design constraints. The bus 1410 links together various circuits including the one or more processors 1404, and storage 1406. Storage 1406 may include memory devices and mass storage devices, and may be referred to herein as computer-readable media and/or processor-readable media. The bus 1410 may also link various other circuits such as timing sources, timers, peripherals, voltage regulators, and power management circuits. A bus interface 1408 may provide an interface between the bus 1410 and one or more transceivers 1412a, 1412b. A transceiver 1412a, 1412b may be provided for each networking technology supported by the processing circuit. In some instances, multiple networking technologies may share some or all of the circuitry or processing modules found in a transceiver 1412a, 1412b. Each transceiver 1412a, 1412b provides a means for communicating with various other apparatus over a transmission medium. In one example, a transceiver 1412a may be used to couple the apparatus 1400 to a multi-wire bus. In another example, a transceiver 1412b may be used to connect the apparatus 1400 to a radio access network. Depending upon the nature of the apparatus 1400, a user interface 1418 (e.g., keypad, display, speaker, microphone, joystick) may also be provided, and may be communicatively coupled to the bus 1410 directly or through the bus interface 1408.

A processor 1404 may be responsible for managing the bus 1410 and for general processing that may include the execution of software stored in a computer-readable medium that may include the storage 1406. In this respect, the processing circuit 1402, including the processor 1404, may be used to implement any of the methods, functions and techniques disclosed herein. The storage 1406 may be used for storing data that is manipulated by the processor 1404 when executing software, and the software may be configured to implement any one of the methods disclosed herein.

One or more processors 1404 in the processing circuit 1402 may execute software. Software shall be construed broadly to mean instructions, instruction sets, code, code segments, program code, programs, subprograms, software modules, applications, software applications, software packages, routines, subroutines, objects, executables, threads of execution, procedures, functions, algorithms, etc., whether referred to as software, firmware, middleware, microcode, hardware description language, or otherwise. The software may reside in computer-readable form in the storage 1406 or in an external computer-readable medium. The external computer-readable medium and/or storage 1406 may include a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a "flash drive," a card, a stick, or a key drive), RAM, ROM, a programmable read-only memory (PROM), an erasable PROM (EPROM) including EEPROM, a register, a removable disk, and any other suitable medium for storing software and/or instructions that may be accessed and read by a computer. The computer-readable medium and/or storage 1406 may also include, by way of example, a carrier wave, a transmission line, and any other suitable medium for transmitting software and/or instructions that may be accessed and read by a computer. Computer-readable medium and/or the storage 1406 may reside in the processing circuit 1402, in the processor 1404, external to the processing circuit 1402, or be distributed across multiple entities including the processing circuit 1402. The computer-readable medium and/or storage 1406 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

The storage 1406 may maintain software maintained and/or organized in loadable code segments, modules, applications, programs, etc., which may be referred to herein as software modules 1416. Each of the software modules 1416 may include instructions and data that, when installed or loaded on the processing circuit 1402 and executed by the one or more processors 1404, contribute to a run-time image 1414 that controls the operation of the one or more processors 1404. When executed, certain instructions may cause the processing circuit 1402 to perform functions in accordance with certain methods, algorithms and processes described herein.

Some of the software modules 1416 may be loaded during initialization of the processing circuit 1402, and these software modules 1416 may configure the processing circuit 1402 to enable performance of the various functions disclosed herein. For example, some software modules 1416 may configure internal devices and/or logic circuits 1422 of the processor 1404, and may manage access to external devices such as a transceiver 1412a, 1412b, the bus interface 1408, the user interface 1418, timers, mathematical coprocessors, and so on. The software modules 1416 may include a control program and/or an operating system that interacts with interrupt handlers and device drivers, and that controls access to various resources provided by the processing circuit 1402. The resources may include memory, processing time, access to a transceiver 1412a, 1412b, the user interface 1418, and so on.

One or more processors 1404 of the processing circuit 1402 may be multifunctional, whereby some of the software modules 1416 are loaded and configured to perform different functions or different instances of the same function. The one or more processors 1404 may additionally be adapted to manage background tasks initiated in response to inputs from the user interface 1418, the transceiver 1412a, 1412b, and device drivers, for example. To support the performance of multiple functions, the one or more processors 1404 may be configured to provide a multitasking environment, whereby each of a plurality of functions is implemented as a set of tasks serviced by the one or more processors 1404 as needed or desired. In one example, the multitasking environment may be implemented using a timesharing program 1420 that passes control of a processor 1404 between different tasks, whereby each task returns control of the one or more processors 1404 to the timesharing program 1420 upon completion of any outstanding operations and/or in response to an input such as an interrupt. When a task has control of the one or more processors 1404, the processing circuit is effectively specialized for the purposes addressed by the function associated with the controlling task. The timesharing program 1420 may include an operating system, a main loop that transfers control on a round-robin basis, a function that allocates control of the one or more processors 1404 in accordance with a prioritization of the functions, and/or an interrupt driven main loop that responds to external events by providing control of the one or more processors 1404 to a handling function.

The processing circuit 1402 may be configured to perform one or more of the functions disclosed herein. For example, the processing circuit 1402 may be configured to operate as a master device coupled to a serial bus. The processing circuit 1402 may be configured to initiate a pulse on a wire coupling the processing circuit 1402 to a subordinate device, present a high impedance to the wire after initiating the pulse and determine whether a subordinate device has terminated the pulse early, indicating a first encoded value. When the subordinate device has not terminated the pulse, processing circuit 1402 may be configured to terminate the pulse after a duration of time sufficient to indicate a second encoded value. In one example, the first encoded value is assigned binary 1 and the second encoded value is assigned binary 0. In another example, the first encoded value is assigned binary 0 and the second encoded value is assigned binary 1. The processing circuit 1402 may be configured to determine the encoded value or may employ a separate PWM decoder.

Figure 15:
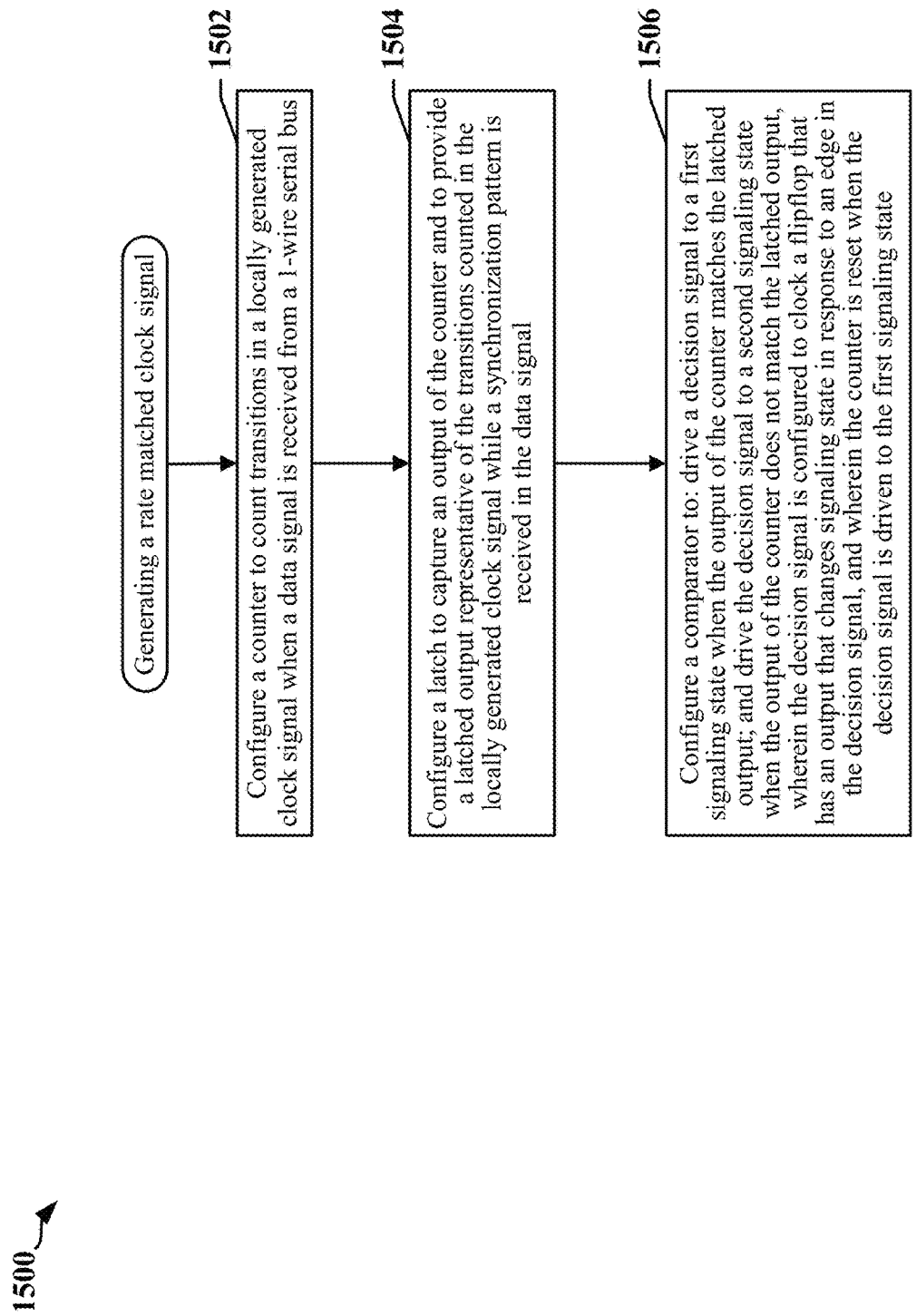
FIG. 15 is a flowchart that illustrates a method for generating a rate matched clock signal in accordance with certain aspects disclosed herein.

FIG. 15 is a flowchart 1500 of a method for generating a rate matched clock signal that may be performed at a receiving device coupled to a 1-wire serial bus. A host device and one or more subordinate devices may be coupled to the 1-wire serial bus. The host device may exchange Manchester-encoded data with subordinate devices. The host device and the subordinate devices may be transmitters and receivers based on the type of transaction conducted over he 1-wire serial bus.

At block 1502, the receiving device may configure a counter to count transitions in a locally generated clock signal when a data signal is received from a 1-wire serial bus. At block 1504, the receiving device may configure a latch to capture an output of the counter and to provide a latched output representative of the transitions counted in the locally generated clock signal while a synchronization pattern is received in the data signal. At block 1506, the receiving device may configure a comparator to drive a decision signal to a first signaling state when the output of the counter matches the latched output, and drive the decision signal to a second signaling state when the output of the counter does not match the latched output. The decision signal may be configured to clock a flipflop that has an output that changes signaling state in response to an edge in the decision signal. The counter may be reset when the decision signal is driven to the first signaling state. The data signal may be encoded using Manchester encoding.

In certain examples, the latched output represents the transitions counted in the locally generated clock signal during a portion of the synchronization pattern. The portion of the synchronization pattern may include two transitions in signaling state of the data signal. The portion of the synchronization pattern may correspond to one or more bit transmission intervals. The portion of the synchronization pattern may correspond to one and a half bit transmission intervals.

In one example, the method includes configuring gating logic to select bits of the output of the counter to be captured by the latch.

In certain implementations, a controller is configured to enable the latch and the counter when the synchronization pattern is being received in the data signal, and enable the counter and the flipflop after the synchronization pattern has been terminated and while transitions are detected in the data signal. The controller may be further configured to disable the flipflop when the synchronization pattern is being received in the data signal, and disable the latch after the synchronization pattern has been terminated. The controller may be further configured to reset the counter when a transition is detected at a center of a bit transmission interval after the synchronization pattern has been terminated.

Figure 16:
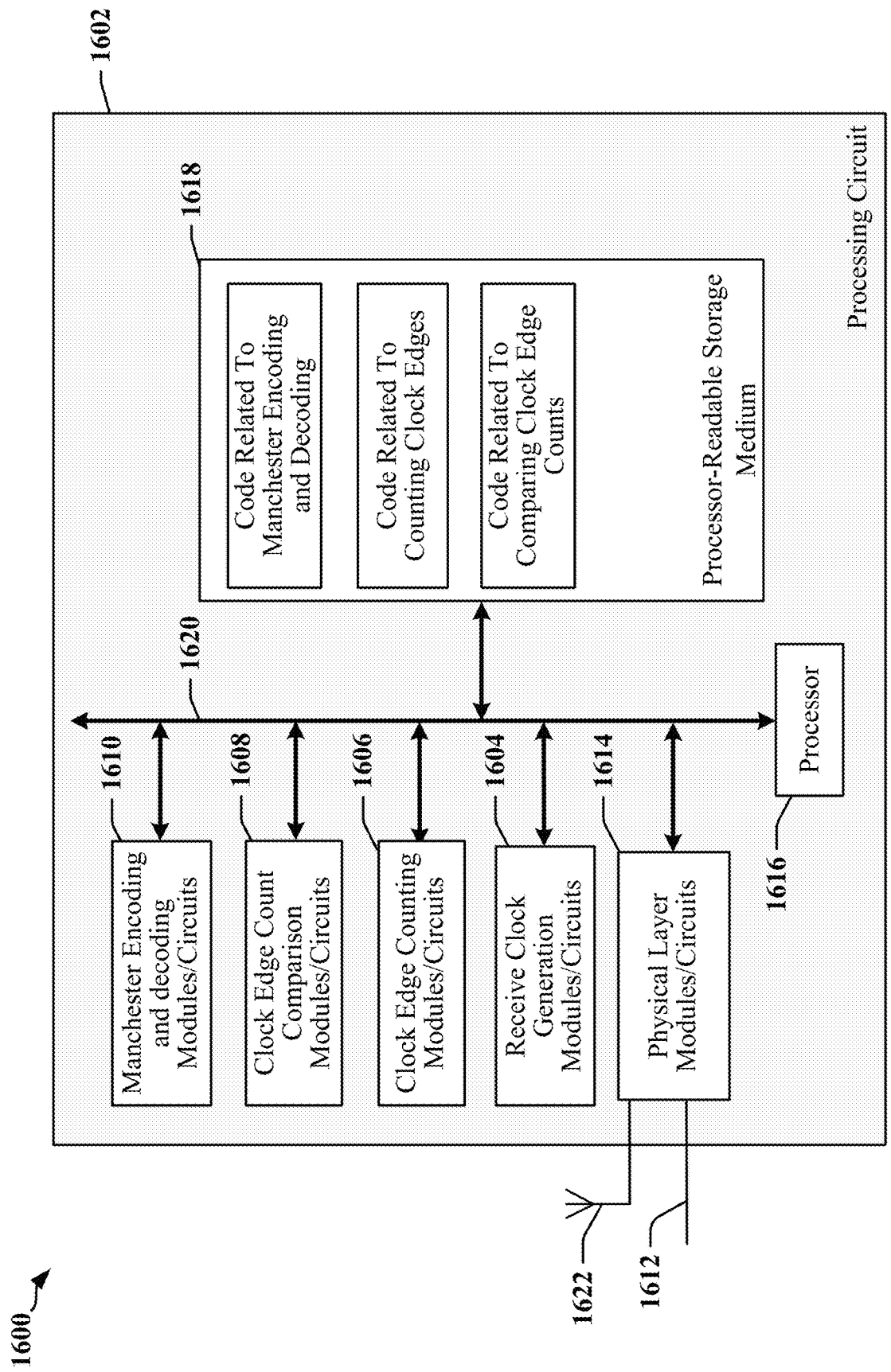
FIG. 16 illustrates an example of a hardware implementation for an apparatus adapted in accordance with certain aspects disclosed herein.

FIG. 16 is a diagram illustrating an example of a hardware implementation for an apparatus 1600 employing a processing circuit 1602. The processing circuit typically has a controller or processor 1616 that may include one or more microprocessors, microcontrollers, digital signal processors, sequencers and/or state machines. The processing circuit 1602 may be implemented with a bus architecture, represented generally by the bus 1620. The bus 1620 may include any number of interconnecting buses and bridges depending on the specific application of the processing circuit 1602 and the overall design constraints. The bus 1620 links together various circuits including one or more processors and/or hardware modules, represented by the controller or processor 1616, the modules or circuits 1604, 1606, 1608 and 1610 and the processor-readable storage medium 1618. One or more physical layer circuits and/or modules 1614 may be provided to support communication over a communication link implemented using a multi-wire bus 1612, through an antenna or antenna array 1622 (to a radio access network for example), and so on. The bus 1620 may also link various other circuits such as timing sources, peripherals, voltage regulators, and power management circuits, which are well known in the art, and therefore, will not be described any further.

The processor 1616 is responsible for general processing, including the execution of software, code and/or instructions stored on the processor-readable storage medium 1618. The processor-readable storage medium 1618 may include a non-transitory storage medium. The software, when executed by the processor 1616, causes the processing circuit 1602 to perform the various functions described herein, and for any particular apparatus. The processor-readable storage medium 1618 may be used for storing data that is manipulated by the processor 1616 when executing software. The processing circuit 1602 further includes at least one of the modules 1604, 1606, 1608 and 1610. The modules 1604, 1606, 1608 and 1610 may be software modules running in the processor 1616, resident/stored in the processor-readable storage medium 1618, one or more hardware modules coupled to the processor 1616, or some combination thereof. The modules 1604, 1606, 1608 and 1610 may include microcontroller instructions, state machine configuration parameters, or some combination thereof.

In one configuration, the apparatus 1600 includes modules and/or circuits 1604 configured or adapted to generate a rate matched receive clock signal, modules and/or circuits 1606 configured or adapted to count clock edges in an internal clock signal, modules and/or circuits 1608 configured or adapted to compare counts of clock edges, and modules and/or circuits 1610 configured or adapted to encode and decode data and commands using Manchester encoding.

In one example, the apparatus 1600 includes physical layer circuits and/or modules 1614 that implement an interface circuit with at least one line driver adapted or configured to couple the apparatus 1600 to a 1-wire serial bus. The apparatus 1600 may have a processor 1616 or protocol controller. The apparatus 1600 may include or be coupled to a keeper circuit through the 1-wire serial bus. The keeper circuit may be operable to maintain the 1-wire serial bus at a constant signaling state after the line driver in the host device and subordinate devices present a high impedance to the 1-wire serial bus.

In a first example, the apparatus 1600 includes means for counting transitions in a locally generated clock signal, means for capturing an output of the counter, and means for comparing counter values. The means for counting transitions in a locally generated clock signal may include a counter configured to count the transitions when a data signal is received from a 1-wire serial bus. The means for capturing an output of the counter may include a latch configured to provide a latched output representative of the transitions counted in the locally generated clock signal while a synchronization pattern is received in the data signal. The means for comparing counter values may include a comparator configured to compare the output of the counter and the latched output, drive a decision signal to a first signaling state when the output of the counter matches the latched output, and drive the decision signal to a second signaling state when the output of the counter does not match the latched output. The apparatus 1600 may include a flipflop clocked by the decision signal and having an output that changes signaling state in response to an edge in the decision signal. The counter may be reset when the decision signal is driven to the first signaling state. The data signal may be encoded using Manchester encoding.

In some examples, the latched output represents the transitions counted in the locally generated clock signal during a portion of the synchronization pattern. The portion of the synchronization pattern may include two transitions in signaling state of the data signal. The portion of the synchronization pattern may correspond to one or more bit transmission intervals. The portion of the synchronization pattern may correspond to one and a half bit transmission intervals.

In one example, the means for capturing the output of the counter includes gating logic configured to select bits of the output of the counter to be captured by the latch.

In certain implementations, the apparatus 1600 includes a controller configured to enable the latch and the counter when the synchronization pattern is being received in the data signal, and enable the counter and the flipflop after the synchronization pattern has been terminated and while transitions are detected in the data signal. The controller may be further configured to disable the flipflop when the synchronization pattern is being received in the data signal, and disable the latch after the synchronization pattern has been terminated. The controller may be further configured to reset the counter when a transition is detected at a center of a bit transmission interval after the synchronization pattern has been terminated.

The apparatus 1600 may be configured as a clock generation circuit that has a counter configured to count transitions in a locally generated clock signal when a data signal is received from a 1-wire serial bus, a latch configured to capture an output of the counter and to provide a latched output representative of the transitions counted in the locally generated clock signal while a synchronization pattern is received in the data signal, a comparator configured to drive a decision signal to a first signaling state when the output of the counter matches the latched output, and to drive the decision signal to a second signaling state when the output of the counter does not match the latched output, and a flipflop having an output that changes signaling state in response to an edge in the decision signal. The counter may be reset when the decision signal is driven to the first signaling state. The data signal may be encoded using Manchester encoding.

In certain examples, the latched output represents the transitions counted in the locally generated clock signal during a portion of the synchronization pattern. The portion of the synchronization pattern may include two transitions in signaling state of the data signal. The portion of the synchronization pattern may correspond to one or more bit transmission intervals. The portion of the synchronization pattern may correspond to one and a half bit transmission intervals.

In one example, the method includes configuring gating logic to select bits of the output of the counter to be captured by the latch.

In certain implementations, a controller is configured to enable the latch and the counter when the synchronization pattern is being received in the data signal, and enable the counter and the flipflop after the synchronization pattern has been terminated and while transitions are detected in the data signal. The controller may be further configured to disable the flipflop when the synchronization pattern is being received in the data signal, and disable the latch after the synchronization pattern has been terminated. The controller may be further configured to reset the counter when a transition is detected at a center of a bit transmission interval after the synchronization pattern has been terminated.

The processor-readable storage medium 1618 may include software, code and/or instructions configured to cause the processor 1616 to configure a counter to count transitions in a locally generated clock signal when a data signal is received from a 1-wire serial bus, configure a latch to capture an output of the counter and to provide a latched output representative of the transitions counted in the locally generated clock signal while a synchronization pattern is received in the data signal, and configure a comparator to drive a decision signal to a first signaling state when the output of the counter matches the latched output, and to drive the decision signal to a second signaling state when the output of the counter does not match the latched output. The decision signal may be configured to clock a flipflop that has an output that changes signaling state in response to an edge in the decision signal. The counter may be reset when the decision signal is driven to the first signaling state. The data signal may be encoded using Manchester encoding.

In certain examples, the latched output represents the transitions counted in the locally generated clock signal during a portion of the synchronization pattern. The portion of the synchronization pattern may include two transitions in signaling state of the data signal. The portion of the synchronization pattern may correspond to one or more bit transmission intervals. The portion of the synchronization pattern may correspond to one and a half bit transmission intervals.

In one example, the software, code and/or instructions may cause the processor 1616 to configure gating logic to select bits of the output of the counter to be captured by the latch.

In certain implementations, the processor 1616 or a controller is configured to enable the latch and the counter when the synchronization pattern is being received in the data signal, and enable the counter and the flipflop after the synchronization pattern has been terminated and while transitions are detected in the data signal. The controller may be further configured to disable the flipflop when the synchronization pattern is being received in the data signal, and disable the latch after the synchronization pattern has been terminated. The controller may be further configured to reset the counter when a transition is detected at a center of a bit transmission interval after the synchronization pattern has been terminated.

Some implementation examples are described in the following numbered clauses:

1. A clock generation circuit, comprising: a counter configured to count transitions in a locally generated clock signal when a data signal is received from a 1-wire serial bus; a latch configured to capture an output of the counter and to provide a latched output representative of the transitions counted in the locally generated clock signal while a synchronization pattern is received in the data signal; a comparator configured to: drive a decision signal to a first signaling state when the output of the counter matches the latched output; and drive the decision signal to a second signaling state when the output of the counter does not match the latched output; and a flipflop having an output that changes signaling state in response to an edge in the decision signal, wherein the counter is reset when the decision signal is driven to the first signaling state.

2. The clock generation circuit as described in clause 1, wherein the latched output represents the transitions counted in the locally generated clock signal during a portion of the synchronization pattern.

3. The clock generation circuit as described in clause 2, wherein the portion of the synchronization pattern includes two transitions in signaling state of the data signal.

4. The clock generation circuit as described in clause 2 or clause 3, wherein the portion of the synchronization pattern corresponds to one or more bit transmission intervals.

5. The clock generation circuit as described in any of clause 2 or clause 3, wherein the portion of the synchronization pattern corresponds to one and a half bit transmission intervals.

6. The clock generation circuit as described in any of clauses 1-5, further comprising gating logic configured to select bits of the output of the counter to be captured by the latch.

7. The clock generation circuit as described in any of clauses 1-6, further comprising a controller that is configured to: enable the latch and the counter when the synchronization pattern is being received in the data signal; and enable the counter and the flipflop after the synchronization pattern has been terminated and while transitions are detected in the data signal.

8. The clock generation circuit as described in clause 7, wherein the controller is further configured to: disable the flipflop when the synchronization pattern is being received in the data signal; and disable the latch after the synchronization pattern has been terminated, wherein the output of the flipflop provides a receive clock signal that has a frequency matched to a data rate associated with the data signal.

9. The clock generation circuit as described in clause 7 or clause 8, wherein the controller is further configured to reset the counter when a transition is detected at a center of a bit transmission interval after the synchronization pattern has been terminated.

10. The clock generation circuit as described in any of clauses 1-9, wherein the data signal is encoded using Manchester encoding.

11. An apparatus comprising: means for counting transitions in a locally generated clock signal, including a counter configured to count the transitions when a data signal is received from a 1-wire serial bus; means for capturing an output of the counter, including a latch configured to provide a latched output representative of the transitions counted in the locally generated clock signal while a synchronization pattern is received in the data signal; means for comparing the output of the counter and the latched output, including a comparator configured to: drive a decision signal to a first signaling state when the output of the counter matches the latched output; and drive the decision signal to a second signaling state when the output of the counter does not match the latched output; and a flipflop clocked by the decision signal and having an output that changes signaling state in response to an edge in the decision signal, wherein the counter is reset when the decision signal is driven to the first signaling state.

12. The apparatus as described in clause 11, wherein the latched output represents the transitions counted in the locally generated clock signal during a portion of the synchronization pattern.

13. The apparatus as described in clause 12, wherein the portion of the synchronization pattern includes two transitions in signaling state of the data signal.

14. The apparatus as described in clause 12 or clause 13, wherein the portion of the synchronization pattern corresponds to one or more bit transmission intervals.

15. The apparatus as described in clause 12 or clause 13, wherein the portion of the synchronization pattern corresponds to one and a half bit transmission intervals.

16. The apparatus as described in any of clauses 11-15, wherein the means for capturing the output of the counter comprises gating logic configured to select bits of the output of the counter to be captured by the latch.

17. The apparatus as described in any of clauses 11-16, further comprising a controller configured to: enable the latch and the counter when the synchronization pattern is being received in the data signal; and enable the counter and the flipflop after the synchronization pattern has been terminated and while transitions are detected in the data signal.

18. The apparatus as described in clause 17, wherein the controller is further configured to: disable the flipflop when the synchronization pattern is being received in the data signal; and disable the latch after the synchronization pattern has been terminated.

19. The apparatus as described in clause 17 or clause 18, wherein the controller is further configured to reset the counter when a transition is detected at a center of a bit transmission interval after the synchronization pattern has been terminated.

20. The apparatus as described in any of clauses 11-19, wherein the data signal is encoded using Manchester encoding.

21. A method for generating a rate matched clock signal, comprising: configuring a counter to count transitions in a locally generated clock signal when a data signal is received from a 1-wire serial bus; configuring a latch to capture an output of the counter and to provide a latched output representative of the transitions counted in the locally generated clock signal while a synchronization pattern is received in the data signal; and configuring a comparator to: drive a decision signal to a first signaling state when the output of the counter matches the latched output; and drive the decision signal to a second signaling state when the output of the counter does not match the latched output, wherein the decision signal is configured to clock a flipflop that has an output that changes signaling state in response to an edge in the decision signal, and wherein the counter is reset when the decision signal is driven to the first signaling state.

22. The method as described in clause 21, wherein the latched output represents the transitions counted in the locally generated clock signal during a portion of the synchronization pattern.

23. The method as described in clause 22, wherein the portion of the synchronization pattern includes two transitions in signaling state of the data signal.

24. The method as described in clause 22 or clause 23, wherein the portion of the synchronization pattern corresponds to one or more bit transmission intervals.

25. The method as described in clause 22 or clause 23, wherein the portion of the synchronization pattern corresponds to one and a half bit transmission intervals.

26. The method as described in any of clauses 21-25, further comprising configuring gating logic to select bits of the output of the counter to be captured by the latch.

27. The method as described in any of clauses 21-26, wherein a controller is configured to: enable the latch and the counter when the synchronization pattern is being received in the data signal; and enable the counter and the flipflop after the synchronization pattern has been terminated and while transitions are detected in the data signal.

28. The method as described in clause 27, wherein the controller is further configured to: disable the flipflop when the synchronization pattern is being received in the data signal; and disable the latch after the synchronization pattern has been terminated.

29. The method as described in clause 27 or clause 28, wherein the controller is further configured to reset the counter when a transition is detected at a center of a bit transmission interval after the synchronization pattern has been terminated.

30. The method as described in any of clauses 21-29, wherein the data signal is encoded using Manchester encoding.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A clock generation circuit, comprising:
a counter configured to count transitions in a locally generated clock signal when a data signal is received from a 1-wire serial bus;
a latch configured to capture an output of the counter and to provide a latched output representative of the transitions counted in the locally generated clock signal while a synchronization pattern is received in the data signal;
a comparator configured to:
drive a decision signal to a first signaling state when the output of the counter matches the latched output; and
drive the decision signal to a second signaling state when the output of the counter does not match the latched output; and
a flipflop having an output that changes signaling state in response to an edge in the decision signal,
wherein the counter is reset when the decision signal is driven to the first signaling state.

2. The clock generation circuit of claim 1, wherein the latched output represents the transitions counted in the locally generated clock signal during a portion of the synchronization pattern.

3. The clock generation circuit of claim 2, wherein the portion of the synchronization pattern includes two transitions in signaling state of the data signal.

4. The clock generation circuit of claim 2, wherein the portion of the synchronization pattern corresponds to one or more bit transmission intervals.

5. The clock generation circuit of claim 2, wherein the portion of the synchronization pattern corresponds to one and a half bit transmission intervals.

6. The clock generation circuit of claim 1, further comprising gating logic configured to select bits of the output of the counter to be captured by the latch.

7. The clock generation circuit of claim 1, further comprising a controller that is configured to:
enable the latch and the counter when the synchronization pattern is being received in the data signal; and
enable the counter and the flipflop after the synchronization pattern has been terminated and while transitions are detected in the data signal.

8. The clock generation circuit of claim 7, wherein the controller is further configured to:
disable the flipflop when the synchronization pattern is being received in the data signal; and
disable the latch after the synchronization pattern has been terminated,
wherein the output of the flipflop provides a receive clock signal that has a frequency matched to a data rate associated with the data signal.

9. The clock generation circuit of claim 7, wherein the controller is further configured to reset the counter when a transition is detected at a center of a bit transmission interval after the synchronization pattern has been terminated.

10. The clock generation circuit of claim 1, wherein the data signal is encoded using Manchester encoding.

11. An apparatus comprising:
means for counting transitions in a locally generated clock signal, including a counter configured to count the transitions when a data signal is received from a 1-wire serial bus;
means for capturing an output of the counter, including a latch configured to provide a latched output representative of the transitions counted in the locally generated clock signal while a synchronization pattern is received in the data signal;
means for comparing the output of the counter and the latched output, including a comparator configured to:
drive a decision signal to a first signaling state when the output of the counter matches the latched output; and
drive the decision signal to a second signaling state when the output of the counter does not match the latched output; and
a flipflop clocked by the decision signal and having an output that changes signaling state in response to an edge in the decision signal,
wherein the counter is reset when the decision signal is driven to the first signaling state.

12. The apparatus of claim 11, wherein the latched output represents the transitions counted in the locally generated clock signal during a portion of the synchronization pattern.

13. The apparatus of claim 12, wherein the portion of the synchronization pattern includes two transitions in signaling state of the data signal.

14. The apparatus of claim 12, wherein the portion of the synchronization pattern corresponds to one or more bit transmission intervals.

15. The apparatus of claim 12, wherein the portion of the synchronization pattern corresponds to one and a half bit transmission intervals.

16. The apparatus of claim 11, wherein the means for capturing the output of the counter comprises gating logic configured to select bits of the output of the counter to be captured by the latch.

17. The apparatus of claim 11, further comprising a controller configured to:
enable the latch and the counter when the synchronization pattern is being received in the data signal; and
enable the counter and the flipflop after the synchronization pattern has been terminated and while transitions are detected in the data signal.

18. The apparatus of claim 17, wherein the controller is further configured to:
disable the flipflop when the synchronization pattern is being received in the data signal; and
disable the latch after the synchronization pattern has been terminated.

19. The apparatus of claim 17, wherein the controller is further configured to reset the counter when a transition is detected at a center of a bit transmission interval after the synchronization pattern has been terminated.

20. The apparatus of claim 11, wherein the data signal is encoded using Manchester encoding.

21. A method for generating a rate matched clock signal, comprising:

configuring a counter to count transitions in a locally generated clock signal when a data signal is received from a 1-wire serial bus;

configuring a latch to capture an output of the counter and to provide a latched output representative of the transitions counted in the locally generated clock signal while a synchronization pattern is received in the data signal; and configuring a comparator to:

drive a decision signal to a first signaling state when the output of the counter matches the latched output; and drive the decision signal to a second signaling state when the output of the counter does not match the latched output, wherein the decision signal is configured to clock a flipflop that has an output that changes signaling state in response to an edge in the decision signal, and wherein the counter is reset when the decision signal is driven to the first signaling state.

22. The method of claim 21, wherein the latched output represents the transitions counted in the locally generated clock signal during a portion of the synchronization pattern.

23. The method of claim 22, wherein the portion of the synchronization pattern includes two transitions in signaling state of the data signal.

24. The method of claim 22, wherein the portion of the synchronization pattern corresponds to one or more bit transmission intervals.

25. The method of claim 22, wherein the portion of the synchronization pattern corresponds to one and a half bit transmission intervals.

26. The method of claim 21, further comprising configuring gating logic to select bits of the output of the counter to be captured by the latch.

27. The method of claim 21, wherein a controller is configured to:

enable the latch and the counter when the synchronization pattern is being received in the data signal; and enable the counter and the flipflop after the synchronization pattern has been terminated and while transitions are detected in the data signal.

28. The method of claim 27, wherein the controller is further configured to:

disable the flipflop when the synchronization pattern is being received in the data signal; and disable the latch after the synchronization pattern has been terminated.

29. The method of claim 27, wherein the controller is further configured to reset the counter when a transition is detected at a center of a bit transmission interval after the synchronization pattern has been terminated.

30. The method of claim 21, wherein the data signal is encoded using Manchester encoding.

* * * * *